(12) United States Patent
Nakasuji et al.

(10) Patent No.: US 8,067,732 B2
(45) Date of Patent: Nov. 29, 2011

(54) ELECTRON BEAM APPARATUS

(75) Inventors: Mamoru Nakasuji, Tokyo (JP); Takeshi Murakami, Tokyo (JP); Tohru Satake, Tokyo (JP); Tsutomi Karimata, Tokyo (JP); Toshifumi Kimba, Tokyo (JP); Matsutaro Miyamoto, Tokyo (JP); Hiroshi Sobukawa, Tokyo (JP); Satoshi Mori, Tokyo (JP); Yuichiro Yamazaki, Tokyo (JP); Ichirota Nagahama, Tokyo (JP)

(73) Assignees: Ebara Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 364 days.

(21) Appl. No.: 11/996,701

(22) PCT Filed: Jul. 24, 2006

(86) PCT No.: PCT/JP2006/314571
§ 371 (c)(1),
(2), (4) Date: Dec. 22, 2008

(87) PCT Pub. No.: WO2007/013398
PCT Pub. Date: Feb. 1, 2007

(65) Prior Publication Data
US 2009/0218506 A1  Sep. 3, 2009

(30) Foreign Application Priority Data

Jul. 26, 2005 (JP) ................. 2005-215234
Sep. 20, 2005 (JP) ................. 2005-272181
Nov. 15, 2005 (JP) ................. 2005-329825

(51) Int. Cl.
*G01N 23/00* (2006.01)
(52) U.S. Cl. ......... 250/311; 250/306; 250/307; 250/310
(58) Field of Classification Search ................ 250/306, 250/307, 310, 311
See application file for complete search history.

(56) References Cited

U.S. PATENT DOCUMENTS
3,472,997 A * 10/1969 Fair et al. ................. 219/121.11
(Continued)

FOREIGN PATENT DOCUMENTS
JP          62-31933 A     2/1987
(Continued)

OTHER PUBLICATIONS

Japanese Office Action dated Jul. 12, 2010, issued in corresponding Japanese Patent Application No. 2006-065143.

(Continued)

*Primary Examiner* — Michael Maskell
(74) *Attorney, Agent, or Firm* — Westerman, Hattori, Daniels & Adrian, LLP

(57) ABSTRACT

An electron beam emitted from an electron gun (G) forms a reduced image on a sample (S) through a non-dispersion Wien-filter (5-1), an electromagnetic deflector (11-1), a beam separator (12-1), and a tablet lens (17-1) as an objective lens. The beam separator (12-1) is configured such that a distance by which a secondary electron beam passes through the beam separator is approximately three times longer than a distance by which a primary electron beam passes through the beam separator. Therefore, even if a magnetic field in the beam separator is set to deflect the primary electron beam by a small angle equal to or less than approximately 10 degrees, the secondary electron beam can be deflected by approximately 30 degrees, so that the primary and secondary electron beams are sufficiently separated. Also, since the primary electron beam is deflected by a small angle, less aberration occurs in the primary electron beam. Accordingly, since a light path length of a primary electro-optical system, it is possible to reduce the influence of space charge and the occurrence of deflection aberration.

4 Claims, 13 Drawing Sheets

U.S. PATENT DOCUMENTS

| | | | |
|---|---|---|---|
| 4,779,046 A * | 10/1988 | Rouberoi et al. ............. 324/751 |
| 4,962,313 A | 10/1990 | Rose |
| 5,084,622 A | 1/1992 | Rose |
| 5,763,898 A | 6/1998 | Nakasuji |
| 5,864,142 A | 1/1999 | Muraki et al. |
| 6,043,491 A | 3/2000 | Ose et al. |
| 6,111,253 A | 8/2000 | Tsuno |
| 6,191,423 B1 | 2/2001 | Krijn et al. |
| 6,310,341 B1 * | 10/2001 | Todokoro et al. ............. 250/305 |
| 6,462,474 B1 | 10/2002 | Symons |
| 6,465,797 B2 | 10/2002 | Okunuki |
| 6,479,819 B1 | 11/2002 | Hamashima et al. |
| 6,509,569 B1 * | 1/2003 | Frosien ..................... 250/396 R |
| 6,563,114 B1 | 5/2003 | Nagahama et al. |
| 6,580,073 B2 | 6/2003 | Plies et al. |
| 6,608,308 B1 | 8/2003 | Takagi et al. |
| 6,635,891 B1 | 10/2003 | Nakano et al. |
| 6,661,008 B2 | 12/2003 | Takagi et al. |
| 6,770,887 B2 | 8/2004 | Krivanek et al. |
| 6,784,437 B2 * | 8/2004 | Rose ..................... 250/396 ML |
| 6,844,548 B2 | 1/2005 | Lopez et al. |
| 6,855,929 B2 | 2/2005 | Kimba et al. |
| 6,924,488 B2 | 8/2005 | Matsuya et al. |
| 6,992,290 B2 | 1/2006 | Watanabe et al. |
| 7,012,262 B2 | 3/2006 | Rose |
| 7,223,973 B2 | 5/2007 | Kimba et al. |
| 7,282,727 B2 | 10/2007 | Retsky |
| 7,321,124 B2 | 1/2008 | Rose |
| 7,351,969 B2 | 4/2008 | Watanabe et al. |
| 7,408,175 B2 | 8/2008 | Kimba et al. |
| 7,465,939 B2 | 12/2008 | Frosien |
| 7,569,838 B2 | 8/2009 | Watanabe et al. |
| 2002/0024013 A1 * | 2/2002 | Gerlach et al. ................ 250/311 |
| 2002/0148961 A1 | 10/2002 | Nakasuji et al. |
| 2003/0085353 A1 | 5/2003 | Almogy et al. |
| 2003/0098415 A1 | 5/2003 | Matsuya et al. |
| 2003/0122076 A1 | 7/2003 | Matsuya et al. |
| 2003/0189181 A1 | 10/2003 | Ohta et al. |
| 2003/0207475 A1 | 11/2003 | Nakasuji et al. |
| 2004/0108457 A1 * | 6/2004 | Kienzle et al. ................ 250/310 |
| 2004/0159787 A1 | 8/2004 | Nakasuji et al. |
| 2004/0188635 A1 | 9/2004 | Kawasaki et al. |
| 2005/0253066 A1 | 11/2005 | Watanabe et al. |
| 2006/0169910 A1 | 8/2006 | Frosien et al. |
| 2007/0228922 A1 | 10/2007 | Nakasuji |
| 2008/0173814 A1 | 7/2008 | Watanabe et al. |
| 2008/0308729 A1 | 12/2008 | Kimba et al. |
| 2008/0315090 A1 * | 12/2008 | Nakasuji et al. ............. 250/306 |
| 2009/0014649 A1 | 1/2009 | Nakasuji et al. |
| 2009/0212213 A1 | 8/2009 | Nakasuji et al. |

FOREIGN PATENT DOCUMENTS

| | | |
|---|---|---|
| JP | 9-270241 A | 10/1997 |
| JP | 11-67139 A | 3/1999 |
| JP | 11-233062 A | 8/1999 |
| JP | 11-238484 A | 8/1999 |
| JP | 2000-228162 A | 8/2000 |
| JP | 2001-148227 A | 5/2001 |
| JP | 2001-513254 A | 8/2001 |
| JP | 2001-291482 A | 10/2001 |
| JP | 2002-367552 A | 12/2002 |
| JP | 2003-157785 A | 5/2003 |
| JP | 2003-173756 A | 6/2003 |
| JP | 2003-187731 A | 7/2003 |
| JP | 2003-234078 A | 8/2003 |
| JP | 2004-087460 A | 3/2004 |
| JP | 2004-165146 A | 6/2004 |
| JP | 2004-214044 A | 7/2004 |
| JP | 2004-214156 A | 7/2004 |
| JP | 2004-235225 A | 8/2004 |
| JP | 2004-303547 A | 10/2004 |
| JP | 2004-335190 A | 11/2004 |
| JP | 2004-342341 A | 12/2004 |
| JP | 2005-197121 A | 7/2005 |
| WO | 99-33085 A1 | 7/1999 |
| WO | 02/37527 A1 | 5/2002 |
| WO | 2005/024890 A1 | 3/2005 |

OTHER PUBLICATIONS

Ioanoviciu, D. et al.; "Third order aberration theory of double Wien filters"; Review of Scientific Instruments, Nov. 2004, pp. 4434-4441, vol. 75, No. 11.

International Search Report of PCT/JP2006/304088 dated May 30, 2006.

International Search Report of PCT/JP2006/305688 dated Jul. 4, 2006.

Rose, H.; "Inhomogeneous Wien filter as a corrector compensating for the chromatic and spherical aberration of low-voltage electron microscopes."; Optik, (1990), pp. 91-107, vol. 84, No. 3.

Tsuno, K.; "Negative aberrations generated by a Wien-type multi-pole corrector"; Japan Society for the Promotion of Science, Jul. 29, 2005, pp. 39-46.

Tsuno K. et al.; "Third-order aberration theory of Wien filters for momchromators and aberration correctors"; Journal of Microscopy, Mar. 2005, pp. 205-215, vol. 217, Pt.

International Search Report of PCT/JP2006/314571 dated Oct. 10, 2006.

International Search Report of PCT/JP2006/314571, date of mailing Oct. 10, 2006.

Japanese Office Action dated Dec. 10, 2010, issued in corresponding Japanese Patent Application No. 2006-065143.

US 6,329,569, 12/2001, Krijn et al. (withdrawn)

* cited by examiner

ELECTRON BEAM APPARATUS

TECHNICAL FIELD

The present invention relates to an electron beam apparatus for evaluating at a high throughput, defect inspections, CD measurements, alignment measurements, and other evaluations for a substrate which has a pattern with a minimum line width of 0.1 µm or less.

BACKGROUND ART

As electron beam apparatuses for inspecting patterns on a substrate for defects and the like for evaluation, there are known a scanning electronic microscope (SEM) and a transmission electronic microscope (TEM) which have ultra-high resolutions using axial chromatic aberration correcting lenses. An electron beam apparatus using an axial chromatic aberration correcting lenses is disclosed in Lecture Preliminary Report of 52-th Applied Physics United Meeting (Spring 2005 in Saitama University), p 812 and p 815. Conventional axial chromatic aberration correcting lenses and spherical aberration correcting lenses have four or twelve electrodes or magnetic poles.

Conventionally, such axial chromatic aberration correcting lenses and spherical aberration correcting lenses have been used to simply reduce the resolution. However, when semiconductor devices are manufactured and/or evaluated using an electron beam apparatus, the processing speed should sometimes be largely increased, inferior to a critical resolution such that the resolution is kept unchanged at several tens of nm. However, since an axial chromatic aberration correcting lens or a spherical aberration correcting lens used in an electron beam apparatus increases a light path length, a space charge effect is increased, which may cause the processing speed increased. Particularly, in the current situation where samples are made increasingly more dense and patterns on the samples are increasingly miniaturized, it is important to solve the problem of space charge and evaluate the patterns at a high throughput. Conventional electron beam apparatuses, however, are incapable of solving such a problem of space charge effect.

Also, conventional multi-pole aberration correcting lenses can cause additional aberration depending on the field of fringes. Moreover, no prior art has been found, which uses an NA aperture member having a large opening, and is capable of increasing a beam current, or reducing the space charge effect, by correcting aberration such as axial chromatic aberration and spherical aberration.

Further, while an electron beam apparatus comprises a beam separator, a place at which the beam separator should be installed is limited to a position conjugate with a sample surface, in order to avoid deflection aberration caused by the beam separator. This leads to such problems as difficulties in down-sizing the electron beam apparatus due to a longer light path length of the apparatus, blurred images resulting from deflection aberration caused by the beam separator, and the like.

Further more, there has conventionally been known an electron beam apparatus which forms a plurality of beams to scan a sample, and detects secondary electron beams emitted from the sample by a plurality of detectors such that a sample image can be captured. However, such an electron beam apparatus has problems of the inability to generate a large beam current and an extremely small throughput, due to aberration, if the resolution is reduced.

In addition, some of conventional electron beam apparatuses employ a high luminance electron gun, reduce a beam into a smaller diameter with a small angular aperture for scanning on a substrate, and capture images. Since such electron beam apparatuses has a small angular aperture and a consequently deep focus depth, the image quality does not exacerbate even if the height of a wafer surface varies in a range of several µm to several tens of µm. However, when patterns on a sample are miniaturized, if axial chromatic aberration is corrected for operation with a large aperture in order to achieve a high throughput, a problem arises in that a large focus depth cannot be provided.

DISCLOSURE OF THE INVENTION

Problems to be Solved by the Invention

The present invention has been made in view of the problems mentioned above. It is an object of the invention to provide an electron beam apparatus which is capable of an ultra-high throughput, though at a resolution of approximately 100 nm, using a novel aberration correction technique.

It is another object of the present invention to provide an electron beam apparatus which evaluates a sample at a high throughput and employs a Wien-filter which does not cause a problem of fringe electromagnetic filed.

It is a further object of the present invention to provide an electron beam apparatus which increases the processing speed by disposing lenses for correcting axial chromatic aberration or spherical aberration in place.

It is another object of the present invention to provide an electron beam apparatus and a pattern evaluation method which are capable of reducing the influence of space charge effect when a miniaturized pattern is evaluated by reducing the light path length of the electron beam apparatus and reducing the occurrence of deflection aberration.

Means for Solving the Problems

To achieve the above object, the present invention provides an electron beam apparatus for irradiating a sample with a primary electron beam, separating secondary electrons emitted from the sample in response thereto, from the primary electron beam by a beam separator, and detecting the separated secondary electrons which have passed through a secondary electro-optical system, wherein, the beam separator comprises a magnetic deflector which is adapted to define a first region through which one of the primary electron beam and secondary electrons passes, and a second region twice or more larger than the first region through which the other passes.

In the above electron beam apparatus according to the invention, it is preferable that the beam separator comprises ferromagnetic material bodies and exciting coils wound around the ferromagnetic material bodies, respectively, and each of the bodies has two magnetic pole surfaces which are magnetically connected to the magnetic surfaces of the other body.

It is also preferable that the secondary electro-optical system is a projection optical system, and the beam separator is adapted to deflect the primary electron beam by a second angle to direct the primary electron beam onto the sample at a third angle which is slightly inclined from a normal of the sample surface, and deflect the second electrons by a first angle which is equal to zero. In this case, it is preferable that the beam separator comprises ferromagnetic material bodies and exciting coils wound around the ferromagnetic material bodies, respectively, and each of the bodies has two magnetic pole surfaces which are magnetically connected to the magnetic surfaces of the other body, and the secondary electro-optical system comprises an axially symmetric shield around an optical axis of the secondary electro-optical system, for preventing a magnetic field generated by the beam separator from introducing into the optical axis.

The invention also provides an electron beam apparatus comprising: an electron gun for emitting a primary electron beam; an electromagnetic deflector for deflecting the primary electron beam; a beam separator for separating the primary beam and secondary electrons emitted from a sample when the sample is irradiated with the primary electron beam; and a detector for detecting a secondary electron beam, wherein the beam separator is configured such that a distance by which the secondary electron beam runs through the beam separator is three times longer than a distance by which the primary electron beam runs through the beam separator. In the electron beam apparatus, it is preferable that the electromagnetic deflector is configured such that the primary electron beam is deflected in a direction opposite to a deflection direction in which the beam separator deflects the primary electron beam, and deflection chromatic aberration occurring in the primary electron beam due to the deflection of the electromagnetic deflector is equal to the absolute value of deflection chromatic aberration occurring in the primary electron beam due to the deflection of the beam separator.

The invention also provides an evaluation method for evaluating a pattern formed on a sample by an electron beam apparatus, which comprises: deflecting a primary electron beam by a small angle and directing it into a beam separator;

deflecting the primary electron beam in a direction perpendicular to the sample to irradiate the same with the primary electron beam; deflecting, in a large angle, secondary electrons emitted from the sample surface by the beam separator to lead it to a secondary electro-optical system; and detecting the secondary electrons received through the secondary electro-optical system by a detector.

BEST MODE FOR CARRYING OUT THE INVENTION

In the following, a variety of embodiments of an electron beam apparatus according to the present invention will be described with reference to the accompanying drawings.

Figure 1:
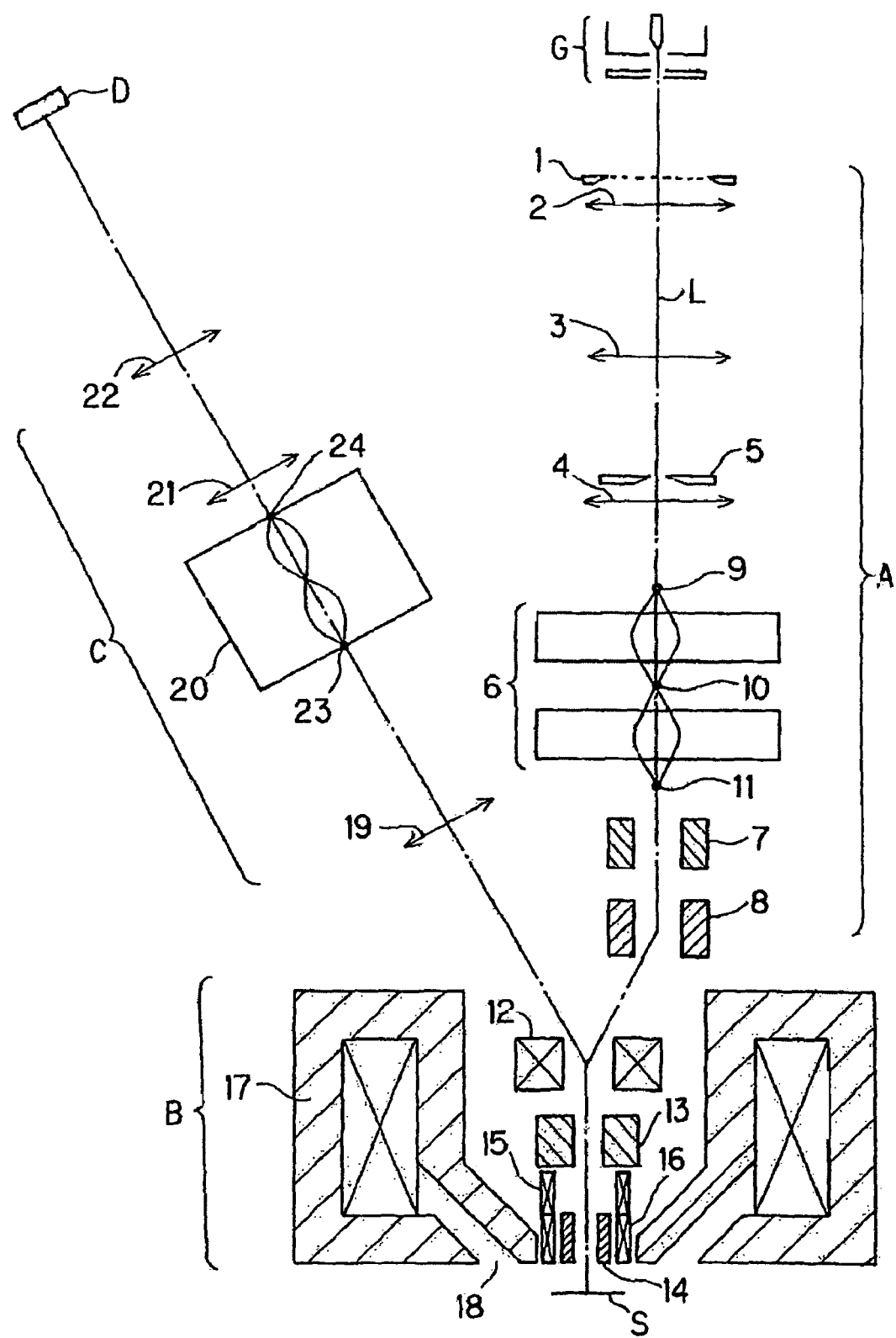
FIG. 1 is a diagram generally showing a first embodiment of an electron beam apparatus according to the present invention.

FIG. 1 is a diagram generally showing a first embodiment of an electron beam apparatus according to the present invention. As shown in FIG. 1, the electron beam apparatus comprises: an electron gun G; an electro-optical system A for transporting a primary electron beam emitted from the electron gun G; an electro-optical system B for irradiating a sample S with the primary electron beam sent from the electro-optical system A and separating a secondary electron beam emitted from the sample S from the primary electron beam; an electro-optical system C for transporting the separated secondary electron beam; and a detector D for receiving the secondary electron beam from the electro-optical system C.

The electro-optical system A comprises a multi-aperture member 1, a condenser lens 2, reduction lenses 3, 4, NA aperture member 5, aberration correcting lens 6, a first scan deflector 7, and a pre-deflector 8 for beam separation. The aberration correction lens 6 comprises, for example, correction lenses at two stages, where each correction lens comprises a Wien-filter. A primary electron beam emitted from the electron gun G is uniformly irradiated to a plurality of apertures of the multi-aperture member 1. In this way, a plurality of primary electron beams are generated. The plurality of generated primary electron beams are converged by the condenser lens 2, and form a cross-over, i.e., an image of a light source created by the electron gun before they impinge on the reduction lens 3.

The image of the multi-aperture member 1 is reduced in scale by the reduction lenses 3, 4 to form a reduced image on an object point 9 of the aberration correction lens 6. The NA aperture member 5 is disposed in front of the reduction lens 4 to ensure a beam resolution of a plurality of primary electron beams which have passed the reduction lens 3. The reduced image created at the object point 9 forms an image at an equal scale at an intermediate point 10 of the aberration correction lens 6 and at an image point 11 of the aberration correction lens 6. The plurality of primary electron beams converged at the image point 11 are again converged by an objective lens (later described) of the electro-optical system B and focused on the surface of the sample S.

The first scan deflector 7 deflects a traveling direction of the plurality of primary electron beams formed at the image point 11 in predetermined increments in a predetermined direction, thereby causing the plurality of primary electron beams to scan on the surface of the sample S. Further, the plurality of primary electron beams have their traveling direction deflected by the pre-deflector 8 such that they impinges on a beam separator of the electro-optical system B at the center thereof.

The electro-optical system B comprises a beam separator 12, a second scan deflector 13, an axially symmetric electrode 14, a first MOL (Moving Objective Lens) deflector 15, a second MOL deflector 16, and an objective lens 17. The objective lens 17 is, for example, an electromagnetic lens which has a magnetic gap 18 on a side close to the sample S. A plurality of primary electron beams deflected by the pre-deflector 8 are further deflected by the second scan deflector 13 after they have passed through the beam separator 12, such that each of the plurality of primary electron beams, which have been deflected twice, is focused at a different position on the surface of the sample S to scan the sample S. In this event, a deflection fulcrum is set at a position at which a total of deflection chromatic aberration and comma aberration caused by the objective lens 17 is minimized.

The first MOL deflector 15 and second MOL deflector 16 are electromagnetic deflectors which operate to further reduce deflection aberration under the condition which is set to be close to the MOL condition. The MOL condition refers to the condition for generating a deflection magnetic field in proportion to a derivation of an axial magnetic field distribution of the objective lens 17. In this event, the deflection fulcrum is positioned at −8. In other words, main light beams of the plurality of primary electron beams are incident in parallel with the optical axis L of the electro-optical system A. The deflection aberration is further reduced under a condition which is set close to the MOL condition. This is because, by setting in such a condition, the axis of the lens can be moved to the position of the beam, so that the main light beams pass along the axis of the lens even when the beam is deflected, and therefore the deflection aberration can be reduced. Specifically, the MOL deflectors 15, 16 apply a deflection magnetic field to a magnetic field of an axial magnetic field distribution of the objective lens such that magnetic lines of force of the objective lens which match the main light beam of the beam becomes straight when the beam is scanned.

A plurality of electron beams which have passed through the electro-optical system B and are focused on the surface of the sample, undergo axial chromatic aberration and spherical aberration by the objective lens 17. However, since the Wien-filter s 6 at two stages in the electro-optical system A operate to create negative axial chromatic aberration and negative spherical aberration, the axial chromatic aberration and spherical aberration created by the objective lens 17 are canceled out by the negative axial chromatic aberration and negative spherical aberration created by the Wien-filter s 6 at two stages. Since the aberration is canceled out in this way, a plurality of primary electron beams can be reduced by the reduction lenses 3, 4 even if the NA aperture of the NA aperture member 5 is chosen to be a large value. The axially symmetric electrode 14 can adjust the degree of the axial chromatic aberration by the objective lens 17 by changing a voltage applied to the electrode.

The first MOL deflector 15 and second MOL deflector 16 operate to cancel a refraction action of the objective lens 17 to a main light beam. For this reason, a main light beam of a plurality of secondary electron beams emitted in a normal direction of the sample S, among a plurality of secondary electron beams emitted from different positions on the surface of the sample S irradiated with a plurality of primary electron beams converged by the electron-optical system B, travels in parallel with the optical axis L without undergoing the refraction action by the objective lens 17, and enters the electro-optical system C such that it is moved away from the direction in which the primary electron beams come by the beam separator 12 (deflected to the left in FIG. 1). The pre-deflector 8 is an electrostatic deflector which operates to cancel deflection chromatic aberration which occurs in a plurality of primary electron beams in the beam separator 12.

The electro-optical system C is a projection optical system which comprises a secondary electron image forming lens 19, an aberration correcting lens 20, a first magnification lens 21, and a second magnification lens 22. In this regard, since the aberration correcting lens 20 is required to simply correct secondary electron beams for axial chromatic aberration, the aberration correcting lens 20 only needs to generate a four-pole electric field and a four-pole magnetic field, and may be, for example, a four-pole Wien-filter. Alternatively, the aberration correction lens 20 may be a six-pole Wien-filter to correct only spherical aberration.

A plurality of secondary electron beams separated from primary electron beams by the beam separator 12 create an image at an object point 23 of the aberration correcting lens 20 by the secondary electron image forming lens 19. Thus, the aberration correction lens 20 is disposed on the image plane of the secondary electron image forming lens 19. The aberration correction lens 20 forms an image of the object point 23 at a point 24. The image created at the point 24 by the aberration correction lens 20 is magnified by the first magnification lens 21 and second magnification lens 22, and creates an image corresponding to the plurality of secondary electron beams on the detector D. The detector D is a multi-detector which generates signals corresponding to the plurality of secondary electron beams incident thereon, respectively. Using the signal thus generated, a processing circuit (not shown) creates a two-dimensional image of the sample S.

Figure 1A:
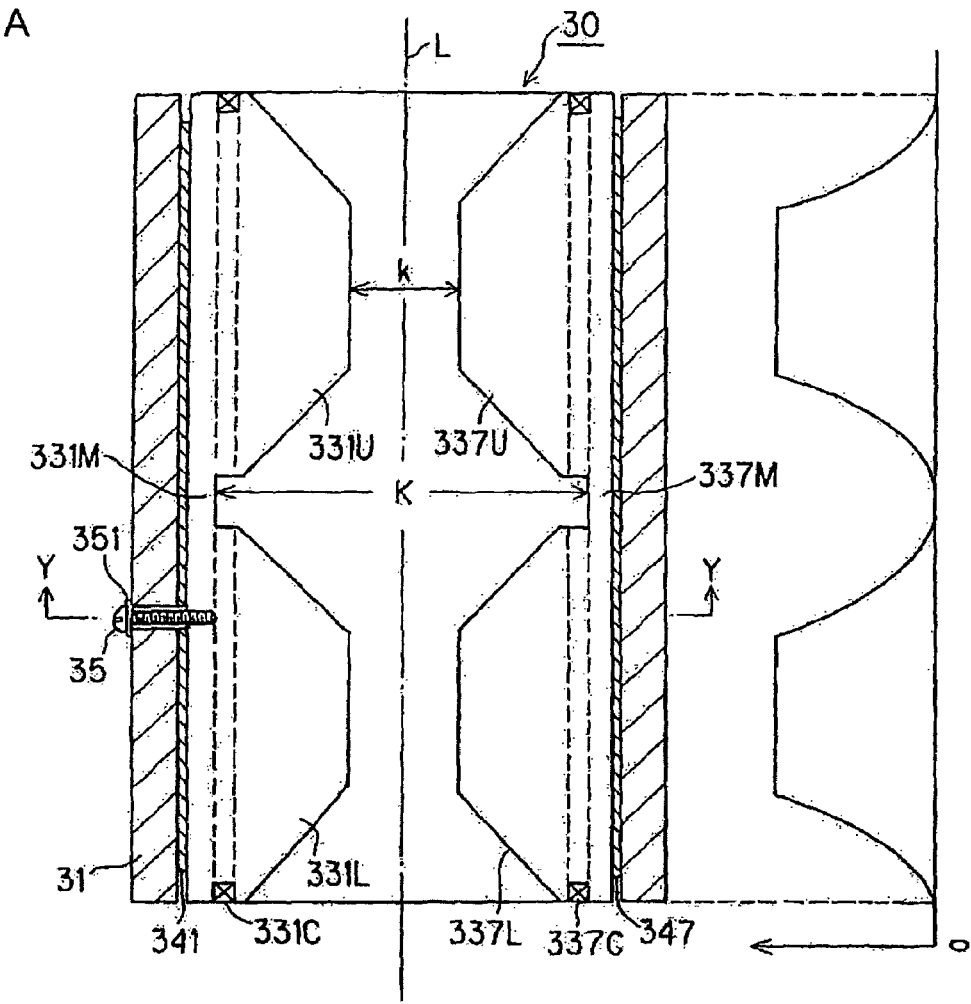
FIG. 1A is a vertical sectional view of an aberration correcting lens provided in the electron beam apparatus shown in FIG. 1, showing a cross section taken along line X-X in FIG. 1B, and also showing a graph representing distributions of a magnetic field strength and an electric field strength in the aberration correcting lens in FIG. 1.
Figure 1B:
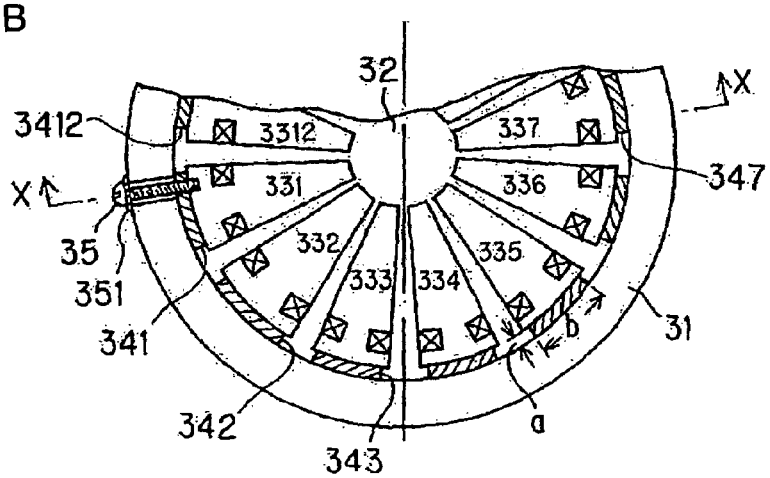
FIG. 1B is a cross-sectional view of an aberration correcting lens provided in the electron beam apparatus shown in FIG. 1, showing a cross section taken along a line Y-Y in FIG. 1A.

The aberration correction lens 6 of the electro-optical system A is required to provide a resolution of approximately 25 nm when a required accuracy is 25-nm pixel dimensions. Accordingly, it is anticipated that aberration occurs due to the influence of a fringe electric field and a fringe magnetic field which occur at an end of a side through which primary electron beams impinges on the aberration correcting lens 6 and at an end of a side from which the primary electron beams exit the aberration correcting lens 6. In order to avoid the influence of such fringe fields, a two-divided Wien-filter is preferably used as the aberration correcting lens 6 to cancel the influence of the fringe fields making use of its symmetry. FIGS. 1A and 1B are cross-sectional views which show an example of the configuration of such a Wien-filter. In addition, FIG. 1A shows distributions of an axial electric field and magnetic field of the filter.

Referring to FIGS. 1A and 1B, a Wien-filter 30 has a permalloy core 31 which is a cylinder having a thickness in a range of 10~20 mm. The permalloy core 31 forms a magnetic circuit, and is designed thick in order to enhance the rigidity of the Wien-filter 30. As shown in detail in FIG. 1B, in a space inside the permalloy core 31, 12 electromagnetic poles (i.e., 12 electrodes which also serve as magnetic poles) 331, 332, 333, ..., 3312 are disposed at equal intervals through insulating spacers 341, 342, 343, ..., 3412, respectively, between the permalloy core 31 and them about a bore 32 which has a predetermined diameter for passing primary electron beams therethrough.

The thickness a (i.e., the width in the radial direction) of each insulating spacer 341-3412 is chosen to be a minimum value so as to have a small magnetic resistance and maintain a required insulating property. On the other hand, the circumferential length b of each insulating spacer is set to a value with which the spacer is not directly visible from the optical axis L such that the insulating spacer are hidden by magnetic pole pieces, as viewed from the optical axis, in FIG. 1B. However, the circumferential length b of the insulating spacers may be larger than the circumferential length of the magnetic pole pieces to prevent discharges. These electromagnetic poles 331-3312 and insulating spacers are attached to the permalloy core 31 at a plurality of required positions by an appropriate fixing means 35. It should be noted that FIGS. 1A and 1B show only one fixing means 35 for simplicity. When fastening screws are used as the fixing means 35, spacers 351 are preferably provided for insulating between the fastening screws and the permalloy core 31.

Each electromagnetic pole is divided into two stages along the optical axis L, and has the same structure with an exciting coil being wound around each electromagnetic hole. Two opposing electromagnetic poles, for example, electromagnetic poles 331, 337 have upper electromagnetic poles 331U, 337U and lower electromagnetic poles 331L, 331L which are arranged at two stages along the optical axis L. These upper and lower electromagnetic poles are coupled by connections 331M, 337M into an integral structure, and exciting coils 331C, 337C are wound around the electromagnetic poles 331, 337 for forming a magnetic field in a predetermined direction. In this way, the respective opposing electromagnetic poles form a magnetic field in a direction orthogonal to the optical axis L. The connections 331M, 337M have a bore diameter of such a degree that no magnetic field or electric field is substantially generated, and is in an integral structure which is free from shifts in position between the upper electromagnetic poles 331U, 337U and the lower electromagnetic poles 331L, 337L.

Further, as shown in FIG. 1A, a cross-sectional shape is formed in trapezoid in a plane including the optical axis L of the upper electromagnetic poles 331U, 337U and lower electromagnetic poles 331L, 337L. Thus, the diameter of the central bore 32 varies from a minimum value h between adjacent electromagnetic holes across the optical axis L to a maximum value k between adjacent connections across the optical axis L. As a result, the strength of an axial magnetic field formed between upper electromagnetic poles adjoining across the optical axis L and between lower electromagnetic poles adjoining across the optical axis L varies between a minimum value and a maximum value over two degrees in the direction of the optical axis L in a shape approximate to a trapezoid, as shown on the right side of FIG. 1A. In this way, the axial magnetic field is formed by six electromagnetic poles along the optical axis L of the Wien-filter 30 such that the magnetic field which varies along the optical axis L of the Wien-filter 30 cancels out a Lorenz force applied to primary electron beams. The distribution of this axial magnetic field is also in the same shape as the axial magnetic field shown in FIG. 1A.

By dividing the aberration correcting lens 6 into two stages in this way, the symmetry of primary electron beams emanating from the object point 9 and converging to the point 10 with primary electron beams emanating from the point 10 and converging to the image point 11 can be improved to cancel the influence due to the fringe field. Further, since the cross-sectional shape of the upper electromagnetic poles and lower electromagnetic poles on a plane including the optical axis L is made trapezoidal to cause the bore 32 to monotonously change, the difference in fringe magnetic field and fringe electric field between the upper end and the lower end of the Wien-filter 30 can be reduced, thereby reducing the influence on the Wien-condition. Also, since the upper side is integrated with the plate side, it is possible to prevent deteriorations in manufacturing accuracy of the upper side and lower side. Notably, the configuration of the Wien-filter shown in FIGS. 1A and 1B may be applied to other embodiments later described, as a matter of course.

Figure 2:
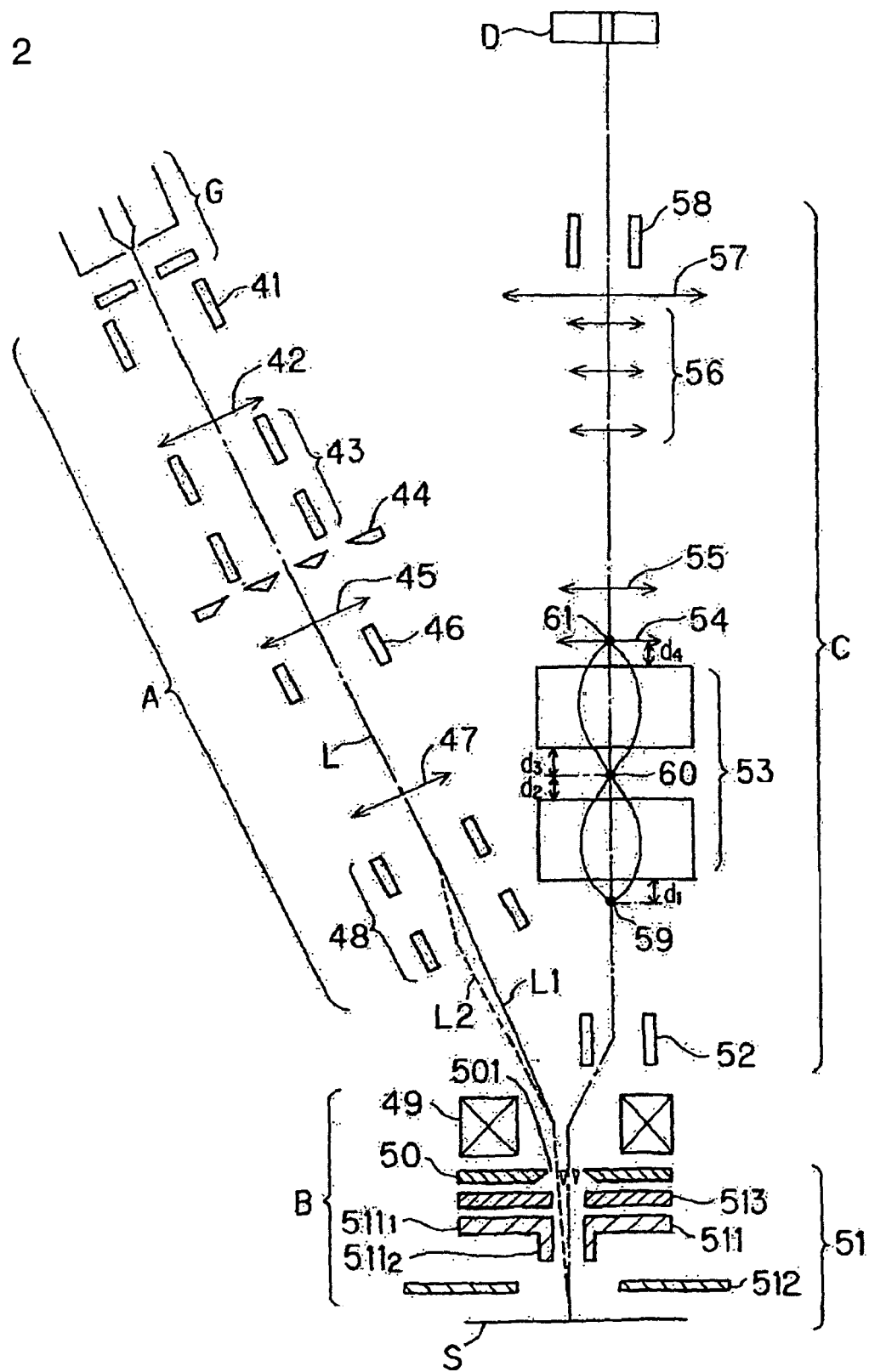
FIG. 2 is a diagram generally showing a second embodiment of an electron beam apparatus according to the present invention.

FIG. 2 is a diagram generally showing a second embodiment of an electron beam apparatus according to the present invention. Likewise, the electron beam apparatus in this embodiment, similar to the first embodiment, comprises an electron gun G, electro-optical systems A, B, C, and a detector D, where electron beams emitted from the electron gun are irradiated to a sample S through the electro-optical systems A, B, and secondary electron beams emitted thereby from the sample S are led to the detector D by the electro-optical system C.

In FIG. 2, the electro-optical system A comprises an alignment deflector 41, a condenser lens 42, an alignment deflector 43, a mold aperture member 44 having a plurality of square apertures, a condenser lens 45, an alignment deflector 46, a mold lens 47, and a deflector 48 for adjusting the trajectory of a primary electron beam. Here, the mold aperture member 44 has a plurality of apertures which are different in dimensions for replacement when an aperture is stained and when the dimensions of pixels are changed, and the electron beam is one. The primary electron beam emitted from the electron gun G is deflected by the deflector 41 so as to travel along the optical axis L, then converged by the condenser lens 42, and is uniformly irradiated to one square aperture of the mold aperture member 44, thereby forming a primary electron beam having a square cross-sectional shape. The primary electron beam of the square cross section is adjusted in scale by the condenser lens 45 and mold lens 47, and is adjusted in trajectory by the alignment deflector 46 and trajectory adjusting deflector 48 such that the square primary electron beam goes toward an aperture member 501 positioned out of the optical axis L, to enter the electro-optical system B. The primary electron beam is controlled to pass along a trajectory L1 when the beam energy is high, and to pass along a trajectory L2 when the beam energy is low because a deflection angle by the beam separator 49 is large.

Figure 2A:
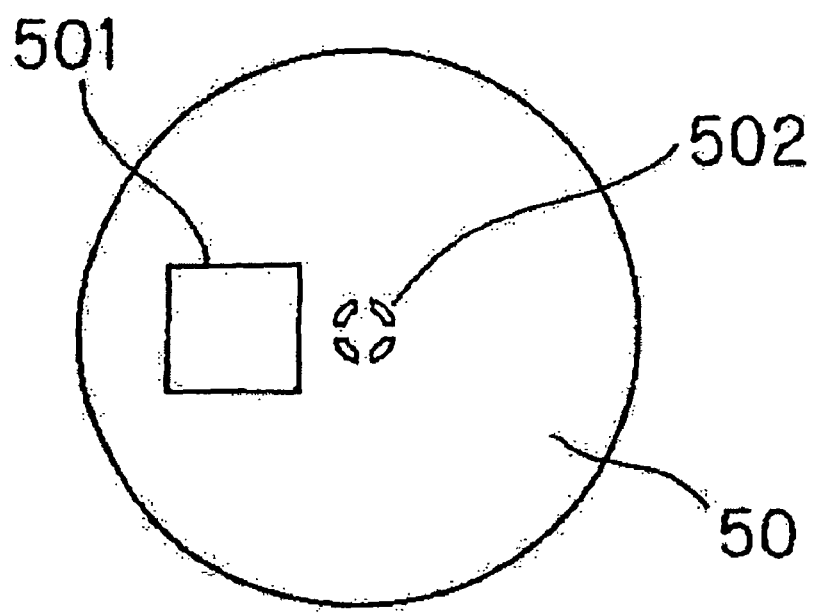
FIG. 2A is a plan view of an NA aperture member provided in the electron beam apparatus shown in FIG. 2.

The electro-optical system B comprises a beam separator 49 which is, for example, an electromagnetic deflector, an NA aperture member 50, and an objective lens 51 having a plurality (three in FIG. 2) of electrodes. The NA aperture member 50 has a square hole 501 and a annular hole 502 divided into four, as shown in FIG. 2A. The square primary electron beam sent from the electro-optical system A has its traveling direction changed by the beam separator 49 so as to impinge at the position of the optical axis of the secondary optical system of the sample S, and is converged into predetermined dimensions by the objective lens, after it has passed through the square hole 501 of the NA aperture member 50, to be focused on the surface of the sample S.

Among the three electrodes of the objective lens 51, a central electrode 511 has a combined shape of a discoidal part $511_1$ and a cylindrical part $511_2$ perpendicular to the discoidal part, as shown in FIG. 2. As a result, the aberration is reduced because the electric field strength is small on the sample surface and the energy of the primary electron beam is high on the optical axis at which the lens exists. Also, by applying a lower potential to an electrode 512 closer to the sample S than that to the central electrode 511, the electric field near the sample surface can be reduced to a value at which a discharge can be avoided, for example, 1.8 kV/mm or lower. Further, the side of the central electrode 511 opposite to the electrode 513 is flat, which can reduce the spacing with the electrode 513 further from the sample S, so that a required focal distance can be set by simply applying a relatively low voltage to the electrode 513.

Secondary electron beams emitted from the sample S by the irradiation of the square primary electron beam are converged by the objective lens 51, and passes through the annular hole 502 divided into four of the NA aperture member 50 for formation into a hollow beam. As will be later described, since the axial chromatic aberration is corrected by an aberration correction lens of the electro-optical system C, a hollow beam having a large aperture angle can be created by the annular hole 502, so that interactions are reduced because the respective beams are spaced apart from one another. This results in less blurring due to the space charge effect. Also, since the primary electron beam passes through the hole 501 (FIG. 2A) spaced away from the annular hole 502, the amount of space charges by the primary electron beam which causes the secondary electron beams to blur is small enough to be neglected. The secondary electron beam formed into a hollow beam by the annular hole 502 is separated from the primary electron beam by the beam separator 49 and is incident on the electro-optical system C.

The electro-optical system C comprises an electrostatic deflector 52, an aberration correcting lens 53, an auxiliary lens 54, a first magnification lens 55, an auxiliary lens set 56, a second magnification lens 57, and a deflector 58. The secondary electron beam separated by the beam separator 59 is deflected by the electrostatic deflector 52 so as to correct deflection chromatic aberration caused by the beam separator 49, and has its traveling direction such that it goes in a direction perpendicular to the sample S to form a secondary electron image at an object point 59 of the aberration correction lens 53.

The aberration correcting lens 53 is, for example, a 12-pole Wien-filter, and has a two-stage structure similar to that shown in FIGS. 1A and 1B, similar to the Wien-filter 6 in the first embodiment. For correcting axial chromatic aberration and spherical aberration, the aberration correction lens 53 is applied with a dipole electromagnetic field so as to satisfy the Wien-condition, and is controlled to create negative axial chromatic aberration by a four-pole electromagnetic field and to create negative spherical aberration by a six-pole electromagnetic field and an eight-pole electromagnetic field. The aberration correction lens 53 converges secondary electrons dispersed from the object point 59 to an intermediate point 60, and subsequently forms a secondary electron beam at an image point 61. The image point 61 is positioned on the main surface of the auxiliary lens 54. As shown in FIG. 2, the length of the aberration correction lens 53 in the direction in which the secondary electron beam travels is smaller than the distance from the object point 59 to the image point 61. Also, a dimension d1 from the object point 59 to one end of the filter is equal to distances d2, d3 from the intermediate point 60 to opposing ends of the filter and to a distance d4 from the other end of the filter to the image point 61.

As described above, when a Wien-filter is used as the aberration correcting lens 53, the beam trajectory of the secondary electron beam is axially symmetric, and the visual field is wide, so that even an extensive secondary electron beam image can be reduced in aberration as a whole. Also, since the visual field is wide, the alignment of the aberration correction lens 53 is facilitated.

The auxiliary lens 54 focuses an image of the annular hole 502 of the NA aperture member 50 on the main surface of the first magnification lens 55 without affecting a focusing condition of the secondary electron image. The first magnification lens 55 magnifies the secondary electron image, and the magnified image is focused on one lens in the auxiliary lens set 56. Further, the secondary electron image is again magnified by the second magnification lens 57 and focused on the detector D. Since the auxiliary lens set 56 comprises a plurality (three in FIG. 2) lenses, it can support even when the pixel dimensions are changed. When the pixel dimensions are minimal, the lens closest to the second magnification lens 57 among the auxiliary lens set 56 is used, while the other lenses are not excited. This secondary electron image focused on the main surface of the lens is magnified large by the second magnification lens 57, and the secondary electron image is formed on the detector D at the largest scaling factor. Conversely, when the pixel dimensions are maximal, the secondary electron image is formed on the lens furthest away from the second magnification lens 57 among the auxiliary lens set 56, and a magnified image of the same dimensions is formed on the detector D.

Figure 2B:
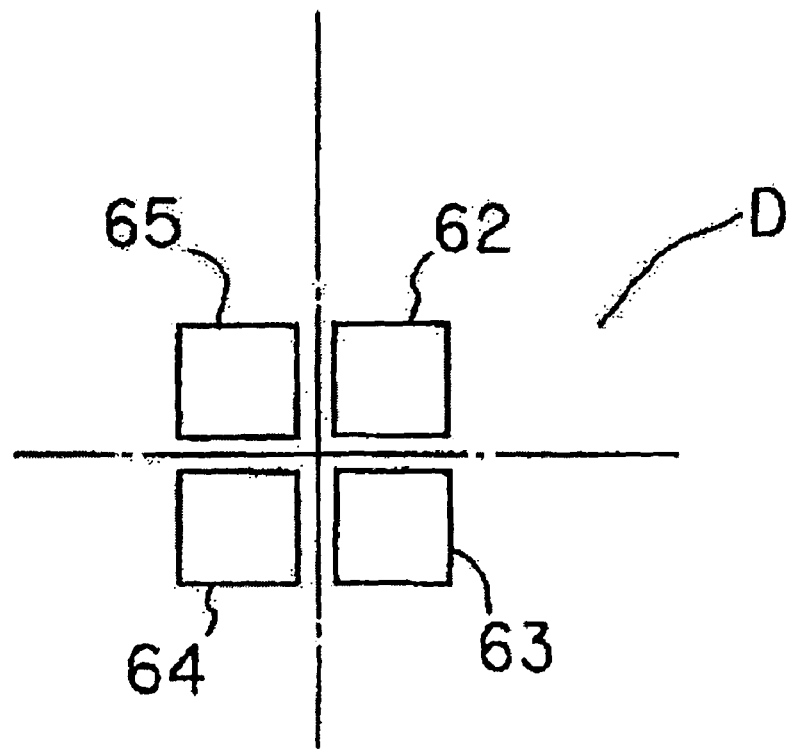
FIG. 2B is a diagram showing an array of CCD detectors of a detector provided in the electron beam apparatus shown in FIG. 2.

When the detector D comprises a plurality of CCD devices arranged in a array, no useless waiting time arises due to a data read time of the CCD longer than an exposure time. For example, when the detector D comprises four CCD devices 62-65 arranged on the same surface, as shown in FIG. 2B, the deflector 58 deflects the secondary electron beam emanating from the second magnification lens 57, and the secondary electron image magnified by the second magnification lens 57 is focused on the four CCD devices 62-65 in order. In this way, secondary electron beams can be continuously detected without useless waiting time even if the data read time of the CCD is four times as long as the exposure time.

Figure 3:
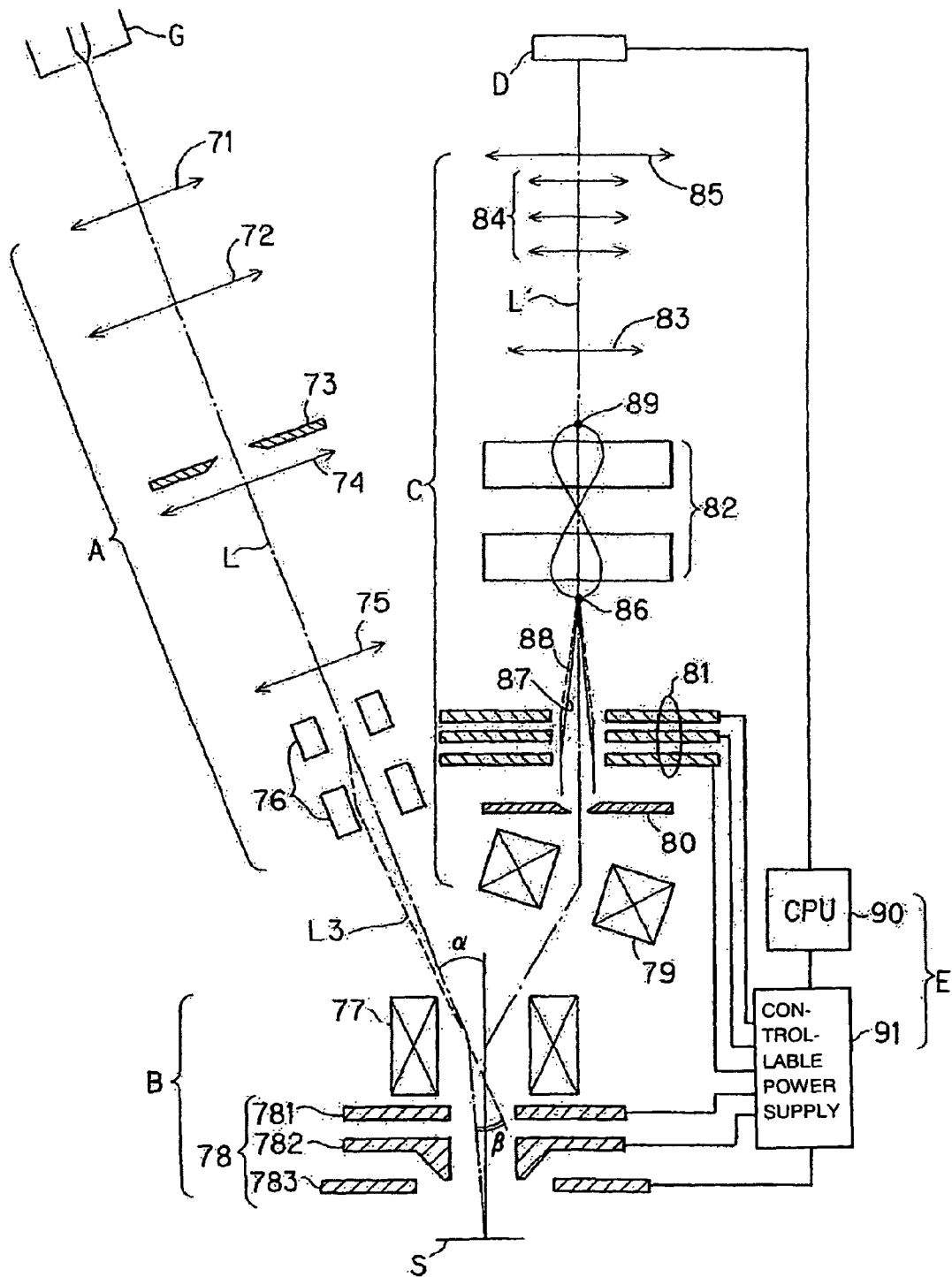
FIG. 3 is a diagram generally showing a third embodiment of an electron beam apparatus according to the present invention.

Next, a third embodiment of an electron beam apparatus according to the present invention will be generally described with reference to FIG. 3. The electron beam apparatus in the third embodiment, similar to the two embodiments so far described, also comprises an electron gun G, electro-optical systems A, B, C, and a detector D, and additionally has a control system E for adjusting a potential applied to an objective lens in accordance with the output from the detector D. An electron beam emitted from the electron gun G passes through the electro-optical systems A, B and is irradiated to a sample S. Secondary electron beams emitted thereby from the sample S are led by the electro-optical system C to the detector D.

The electro-optical system A comprises two condenser lenses 71, 72, an aperture member 73 having a rectangular aperture, two lenses 74, 75, and a two-stage deflector 76 for adjusting an incident point. The electron gun G has a cathode of, for example, $LaB_6$, where an electron beam emitted from the cathode is converged by the condenser lenses 71, 72 at two stages, and is irradiated to the rectangular aperture of the aperture member 73 at uniform irradiation intensity. A primary electron beam formed into a rectangular cross section by this aperture is scaled down or up by the lenses 74, 75 at two stages at a desired scaling factor, and is adjusted in the traveling direction by the deflector 76 such that it impinges at a predetermined incident point of the electro-optical system B. Such an adjustment is required because a deflection angle is large at the beam separator 77 when the primary electron beam has small energy so that a trajectory L3 is taken.

The electro-optical system B comprises a beam separator 77 and a first objective lens 78 which has three electrodes, where the beam separator 77 is, for example, an electromagnetic deflector. The primary electron beam, the traveling direction of which has been adjusted by the deflector 76, impinges toward a point spaced by a predetermined distance from the center of the beam separator 77, for example, a point spaced by 4 mm, and is deflected by an angle $\beta$ ($<\alpha$) by the beam separator 77. $\beta$ is, for example, 23 degrees. In this way, the primary electron beam enters the first objective lens 78 with an angle of $\beta-\alpha$ with respect to the sample S, is converged by the first objective lens 78, and is slightly deflected and irradiated to the sample S.

Secondary electron beams emitted from the sample S by the irradiation of the primary electron are converged by the first objective lens 78, then have their traveling direction deflected by the beam separator 77 such that they separate from the primary electron beam, and enters the electro-optical system C. The electro-optical system C comprises a beam trajectory adjusting deflector 79, an NA aperture member 80, a second objective lens 81 having three electrodes, an aberration correcting lens 82, a first magnification lens 83, an auxiliary lens set 84, and a second magnification lens 85.

The secondary electron beams separated by the beam separator 77 are further deflected by the beam trajectory adjusting deflector 79 to travel in a direction parallel with a normal direction of the sample S. The beam trajectory adjusting deflector 79 is also, for example, an electromagnetic deflector, and deflects the secondary electron beam by the same angle as the angle by which the beam separator 77 deflects the primary electron beam and in the opposite direction, i.e., by $-\alpha$. In this way, a main light beam of the secondary electron beam is directed perpendicularly to the sample S, and beams dispersed from the sample become parallel between the lenses at two stages, so that deflection chromatic aberration can be removed. In this regard, the deflection in the beam separator 77 and beam trajectory adjusting deflector 79 can cause astigmatism. For removing this, these beam separators are preferably multiplexed with a current for adjusting the astigmatism. Also, by inclining the beam trajectory adjusting deflector 79 by one-half of its deflection angle with respect to the optical axis L' of the electro-optical system C, distortions can be prevented even if the beam separator has a small diameter.

The secondary electron beam deflected by the beam trajectory adjusting deflector 79 is limited by the NA aperture member 80, and forms a secondary electron image, which has been slightly reduced in scale by the second objective lens 81, at an object point 86 of the aberration correction lens 82. In this regard, comma aberration can be minimized by adjusting the position of the NA aperture member 80 in the direction of the optical axis L'. Also, scaling factor chromatic aberration can be sufficiently reduced as well. Here, when the first objective lens 78 and second objective lens 81 are set at large reduction factors, the secondary electron beam travels along a path indicated by a solid line 87, whereas when the first objective lens 78 and second objective lens 81 are set at small reduction factors, the secondary electron beam travels along a path indicated by a dotted line 88.

The configuration of the aberration correcting lens 82 is similar to the aberration correcting lens 6 shown in FIG. 1, so that a description thereon is omitted here. The aberration correcting lens 82 forms the secondary electron image at the object point 86 at an image point 89. The secondary electron beam from the image point 89 is adjusted in scaling factor by the first magnification lens 83, auxiliary lens set 84, and second magnification lens 85 to form an image on the detector D, which has been magnified to a desired size so as to match a pixel pitch of the detector D.

The output of the detector D is supplied to a CPU 90 of the control system E, and the CPU 90 generates a two-dimensional image signal of the sample surface using the output of the detector D. When aberration is included in an image displayed using this two-dimensional image signal, a controllable power supply 91 adjusts a voltage applied to each electrode of the first objective lens 78 and second objective lens 81 based on an instruction from the CPU 90 in order to correct the aberration.

Here, a description will be made on the first objective lens 78 and second objective lens 81. The first objective lens 78 has electrodes 781, 782, 783, where the central electrode 782 comprises a frusto-conical part having an aperture at the center thereof for passing electron beams therethrough, and a discoidal part around the frusto-conical part. By so shaping the first objective lens 78, comma aberration can be reduced, and moreover, a desired focal distance can be provided with a relatively low positive voltage. By reducing a voltage applied to the electrode 783 closer to the sample S, an electric field strength on the sample surface can be reduced to avoid a discharge. Conversely, when the electrode 783 is applied with a higher voltage, an axial chromatic aberration coefficient of the objective lens 78 can be reduced, so that axial chromatic aberration caused by the first objective lens 78 and second objective lens 81 can be readily canceled out by negative axial chromatic aberration of the aberration correction lens 82. Also, by changing the voltage applied to the electrode 781, for example, by approximately ±100 V, defocusing due to asperities on the sample surface can be dynamically corrected.

The second objective lens 81 also has a plurality (three in FIG. 3) of electrodes, where the scaling factor of a secondary electron image can be adjusted by adjusting a voltage applied to the central electrode without changing an image forming position 86 of the primary electron beam. Using this result, it is possible to finely adjust spherical aberration correction coefficients or axial chromatic aberration correction coefficients of the first objective lens 78 and second objective lens 81.

Figure 4A:
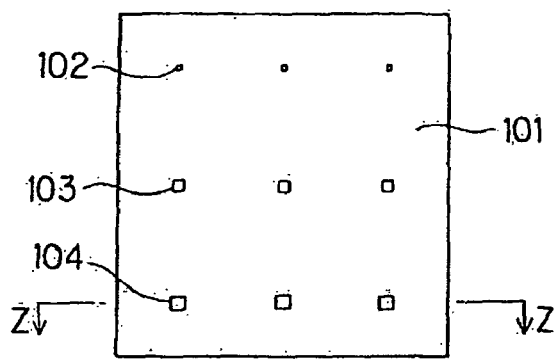
FIG. 4A is a plan view of a marker available in the electron beam apparatus according to the present invention.
Figure 4B:
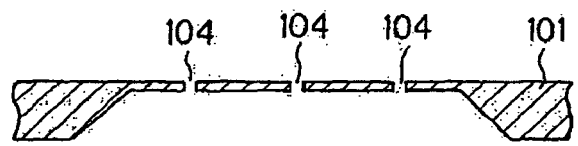
FIG. 4B is a cross-sectional view taken along a line Z-Z in FIG. 4A.

Referring to FIGS. 4A-4E, a description will be made on marks which can be used for beam adjustment in the first to third embodiments of the electron beam apparatuses of the present invention. FIG. 4A shows a marker plate 101 which has three holes that differ in diameter. The marker plate 101 illustrated in FIG. 4A is formed with a small marker holes 102 (three) having the smallest diameter, middle marker holes 103 (three) having a middle diameter, and larger marker holes 104 (three) having the largest diameter which are arranged in a row direction, respectively. Regions other than these markers are coated on both sides with a conductive material which exhibits a large secondary electron emission rate. FIG. 4B shows a cross-sectional shape of the marker plate 101.

Figure 4C:
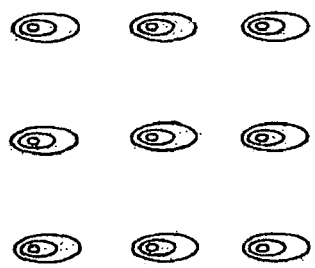
FIG. 4C is a diagram showing an image of a marker hole when alignment is not appropriate.
Figure 4D:
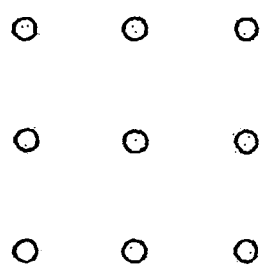
FIG. 4D is a diagram showing an image of the marker hole when alignment is appropriate.
Figure 4E:
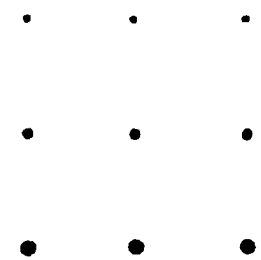
FIG. 4E is a diagram showing an image of the actual hole.

The marker plate 101 is placed at the same height as the sample S, and is irradiated with a primary electron beam, and a two-dimensional image of the marker hole 102, 103 or 104 is detected by the detector D. Examples of images detected in this event are shown in FIGS. 4C, 4D and 4E. When an alignment of the correction lens is not appropriate on the light path of the electron beam from the electron gun G to the detector D through the sample D, comma aberration is observed as shown in FIG. 4C, so that an alignment must be done to generate a circular image as shown in FIG. 4D. Actually, as shown in FIG. 4E, the marker hole 102 is small, so that the resulting image suffers from an extremely low contrast, which makes it difficult to detect the aberration. On the other hand, the image of the marker 104 presents high contrast and is clear, but the large marker hole increases large blur of the image, possibly leading to a risk of overlooking subtle aberration. Accordingly, an optimal hole diameter may be selected.

Figure 4F:
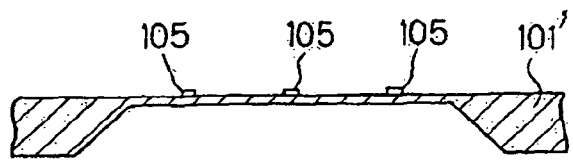
FIG. 4F is a cross-sectional view of an alternative marker.

Alternatively, as another marker which may be used, a marker plate 101' may be made of a thin film which exhibits a small secondary electron beam emission rate, and a marker 105 by dots of heavy metal may be formed on a Si thin film instead of the marker holes 102-104, as shown in FIG. 4F.

Figure 5:
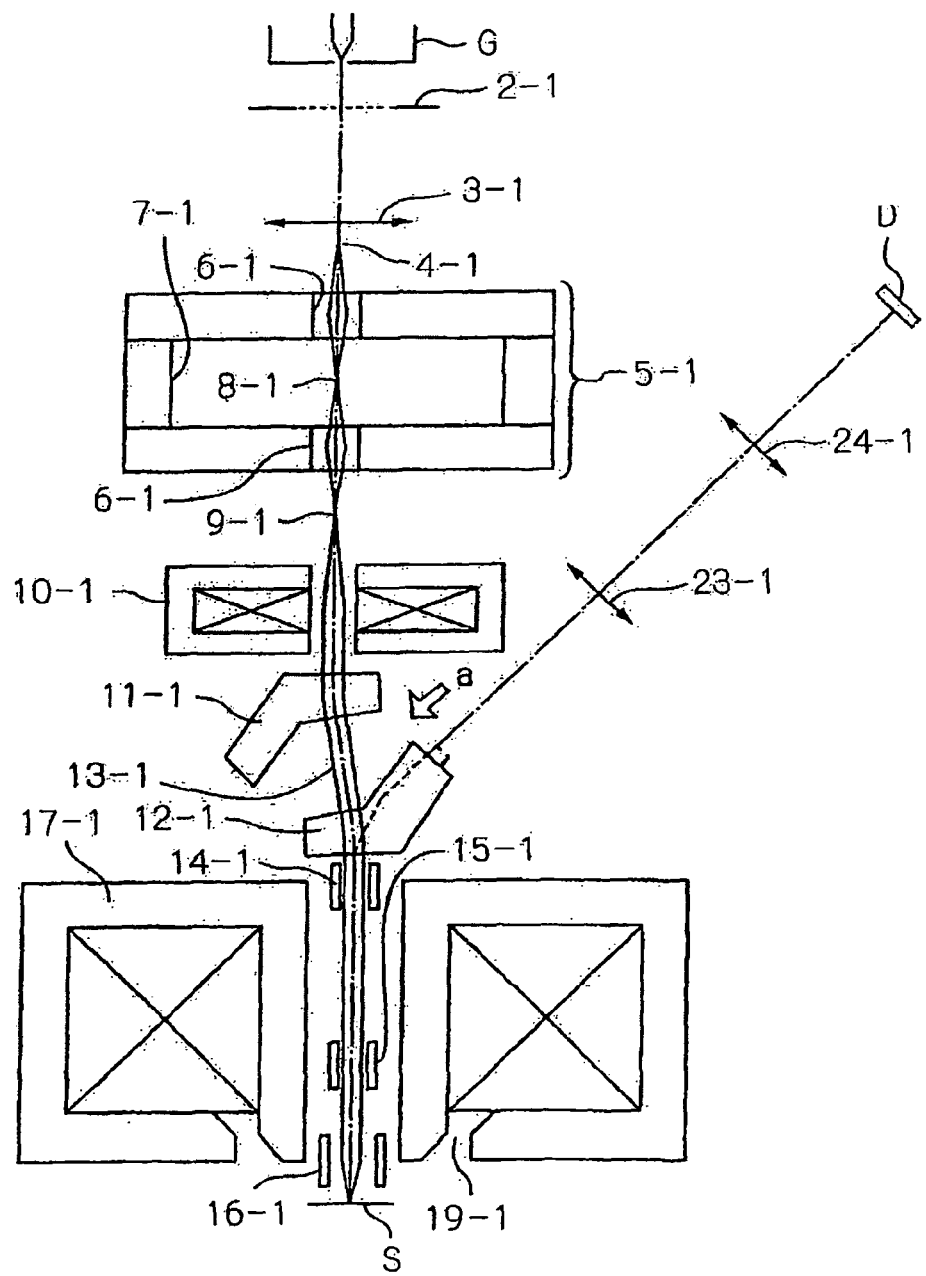
FIG. 5 is a diagram generally showing a fourth embodiment of an electron beam apparatus according to the present invention.

FIG. 5 shows a schematic diagram of a fourth embodiment of an electron beam apparatus according to the present invention. This embodiment is a multi-beam SEM electron beam apparatus. In this electron beam apparatus, electron beams emitted from an electron gun G is irradiated to a plurality of apertures 2-1, and forms a reduced image at a position 4-1 by a reduction lens 3-1. Then, the electron beams are focused at positions 8-1 and 9-1 by a non-dispersion Wien-filter 5-1 and further reduced in scale by tablet lenses 10-1 and 17-1, and forms a reduced image of multi-beams on a sample S. The tablet lens 17-1 is a magnetic lens which comprises a magnetic gap 19-1 defined on a side of the lens closer to the sample S, and functions as an objective lens.

Describing in a more specific manner, the Wien-filter 5-1 is configured to perform a convergence action in two regions on the incident side and exiting side in which a bore diameter 6-1 is set smaller, and not to perform a filter action in a central region in which a bore diameter 7-1 is set larger. A beam emanating from the reduced image at the position 9-1 is transformed into a parallel beam 13-1 by the tablet lens 10-1, and is deflected by an electromagnetic deflector 11-1 such that it impinges on a beam separator 12-1 at a predetermined position. The parallel beams 13-1 are deflected by the beam separator 12-1 such that it orients perpendicularly to the surface of the sample S. The parallel beams deflected by the beam separator 13-1 are raster scanned by electrostatic deflectors 14-1 and 15-1 at two stages, and are reduced in aberration by an axially symmetric electrode 16-1. The electrostatic deflectors 14-1 and 15-1 at two stages for performing the raster scan are driven under the condition that optimizes a deflection fulcrum and two deflecting directions. Also, the positions of the deflectors 14-1 and 15-1 in the Z-direction (optical axis direction) can be optimized by a simulation, as will be later described. Aberration can be reduced by applying a high voltage which does not cause a discharge between the axially symmetric electrode 16-1 and the sample S.

Secondary electrons emitted from the sample S by the irradiation of the primary electron beams impinge on the beam separator 12-1 while deflected in the optical axis direction by the electrostatic deflectors 15-1 and 14-1. The secondary electrons are deflected to the right in the figure by the beam separator 12-1 to go toward a magnification lens 23-1 in a secondary electro-optical system. A secondary electron image magnified by the magnification lens 23-1 is further magnified by a next magnification lens 24-1 to generate a multi-channel SEM image on a detector D.

The beam separator 12-1 comprises an electromagnetic deflector, and is configured, as shown in FIG. 5, such that the distance by which a secondary electron beam runs within the beam separator 12-1 is approximately three times as long as a distance by which a primary electron beam runs within the beam separator 12-1. Therefore, even if a magnetic field in the beam separator 12-1 is set to deflect the primary electron beam only by a small angle of about 10 degrees, the secondary electron beam is deflected by about 31.8 degrees (=3×10×√(4.5/4)), so that the primary electron beam is sufficiently separated from the secondary electron beam. This is because the deflection angle is inversely proportional to one-half power of the energy from the fact that the primary electron beam and secondary electron beam have the energy of 4.5 KeV and 4.0 KeV, respectively, at the position of the beam separator 12-1, and the beam separator 12-1 is an electrostatic deflector. From the foregoing equation, the deflection angle of the secondary electron beam is found.

By setting the beam separator 12-1 such that the primary electron beam can be deflected only by a small angle equal to or less than approximately 10 degrees, the primary electron beam will suffer from relatively small aberration. Also, even if deflection chromatic aberration occurs in the primary electron beam due to the beam separator 12-1, the deflection chromatic aberration can be canceled out by setting the absolute value of the aberration equal to the absolute value of deflection chromatic aberration caused by the electromagnetic deflector 11-1 which deflects in a direction opposite to the deflection direction by the beam separator 12-1. In addition, other deflection aberration is also small.

Since deflection aberration is not so problematic for the secondary electron beam, no specific problem will arise even if it is largely deflected by the beam separator 12-1.

Further, since deflection chromatic aberration caused by the beam separator 12-1 is canceled by the deflector 11-1, the beam separator 12-1 need not be placed at a position conjugate with the sample surface. This results in an increase in the degree of freedom in designing of the electro-optical systems, a large reduction of the light path, and a reduction of the space charge effect.

Figure 5A:
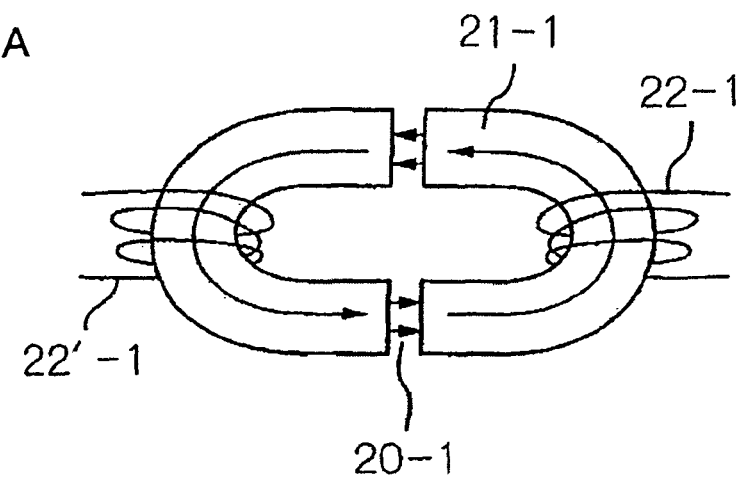
FIG. 5A is a diagram showing the configuration of an electromagnetic deflector provided in the electron beam apparatus shown in FIG. 5.

FIG. 5A shows the electromagnetic deflector 11-1 and beam separator 12-1 of the electron beam apparatus shown in FIG. 5 in a direction of an arrow a in FIG. 5 and in a direction parallel with the sheet surface. The beam separator 12-1 is formed of two magnetic gaps 20-1 formed by magnetic pole surfaces comprised of two parallel flat plates in a permalloy core 21-1 which is a ferromagnetic material, where the upper gap is passed through only by the primary electron beam, while the lower gap is passed through by both the primary and secondary electron beams. The numerals 22-1 and 22'-1 designate exciting coils.

Figure 5B:
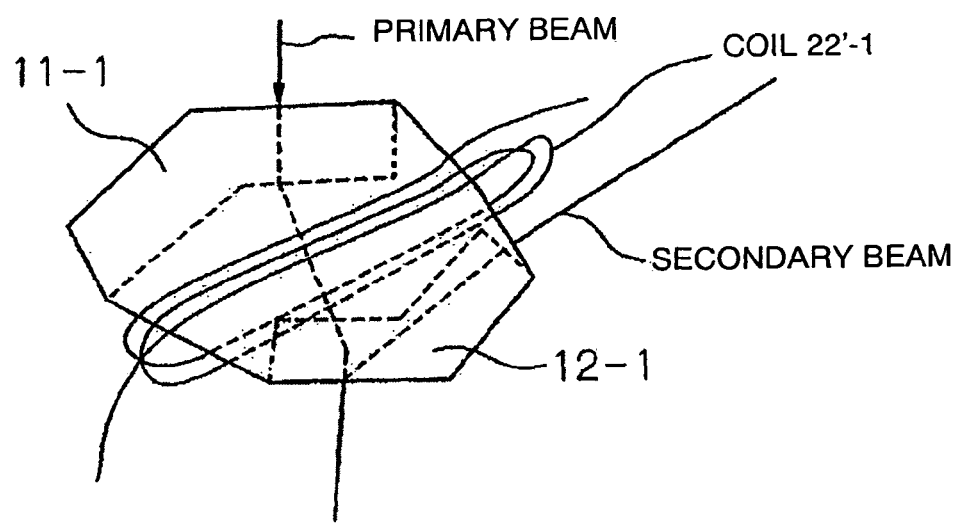
FIG. 5B is a diagram showing the configuration of an electromagnetic deflector provided in the electron beam apparatus shown in FIG. 5.

FIG. 5B is a diagram of the electromagnetic deflector 11-1 and beam separator 12-1 as viewed in the direction perpendicular to the sheet surface of FIG. 5 (from the front). A magnetic core which forms part of the electromagnetic deflector 11-1 goes out from the back side of the sheet surface of FIG. 5B to the front direction, is curved in a lower right direction, and goes perpendicular to the sheet surface. The magnetic core on the back side of the sheet surface which forms part of the beam separator 10-1 goes out to the back side of the sheet surface, is curved on an upper left side of the figure, and goes from the back side of the sheet surface to the sheet surface direction. The cross section of the magnetic core comprises an upwardly convex and downwardly convex shape, as shown in FIGS. 5 and 5B. Then, an exciting coil 22-1 is wound such that magnetic lines of force going from the back side to the front side of the sheet in the electromagnetic deflector 11-1 goes from the front side to the back side of the sheet surface in the beam separator 12-1. In this regard, in FIG. 5B, the exciting coil 22'-1 only shows a coil on the front side of the sheet surface. Since FIG. 5B is a drawing viewed from an upper side orthogonal to the sheet surface of FIG. 5, the left-hand coil, i.e., the coil 22'-1 on FIG. 5A is the coil shown in FIG. 5B when viewed from the arrow of FIG. 5.

Since the beam separator 12-1 comprises such a configuration, the primary electron beam can be deflected by a small angle, while the second electrons can be deflected by a larger angle, the problematic deflection aberration of the primary electron beam can be relatively reduced, and the light path length of the primary electro-optical system can be reduced.

Figure 5C:
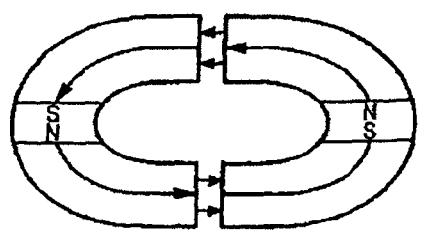
FIG. 5C is a diagram showing the configuration of an electromagnetic deflector provided in the electron beam apparatus shown in FIG. 5.

While the foregoing beam separator 12-1 has a structure in which a magnetic core is wound with an exciting coil, a permanent magnet may be used instead of winding the exciting coil. FIG. 5C shows a beam separator which employs a permanent magnet, where two thin permanent magnets, labeled NS, are disposed at appropriate positions of a magnetic core. Using the beam separator shown in FIG. 5C, no coil need be placed in a vacuum, the strength of the magnetic field does not fluctuate, so that it can operate with stability. Also, like the beam separators shown in FIGS. 5A and 5B, the primary electron beam can be deflected by a small angle, while the second electrons can be deflected by a larger angle, the problematic deflection aberration of the primary electron beam can be relatively reduced, and the light path length of the primary electro-optical system can be reduced.

Figure 6:
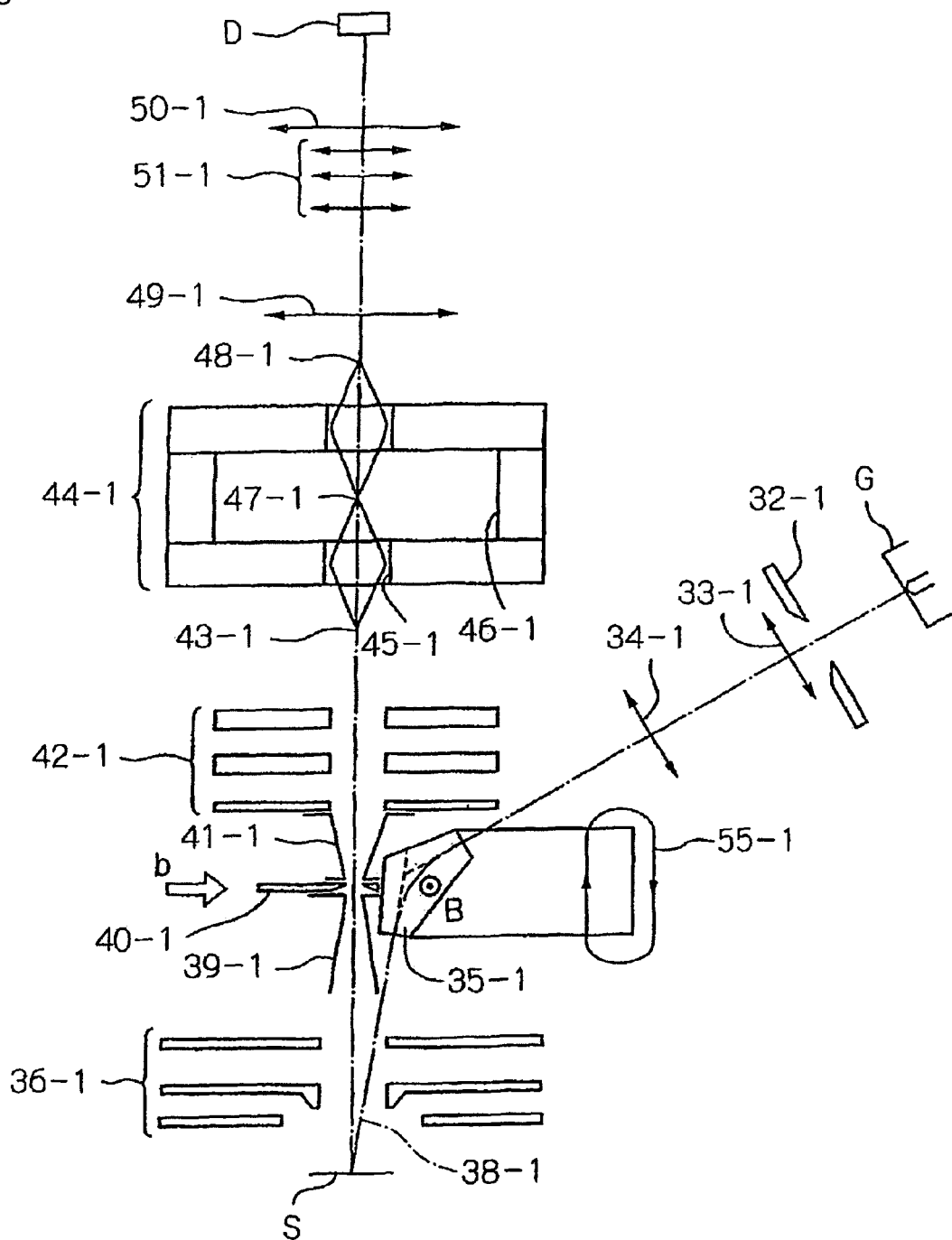
FIG. 6 is a diagram generally showing a fifth embodiment of an electron beam apparatus according to the present invention.

FIG. 6 shows a fifth embodiment of an electron beam apparatus according to the present invention. In this embodiment, the electron beam apparatus comprises a projection electro-optical system. In this electron beam apparatus, an electron beam emitted from an electron gun G is irradiated to a rectangular aperture 32-1 at a uniform intensity, and a resulting rectangular primary electron beam is adjusted in reduction factor by lenses 33-1 and 34-1 at two stages, and is deflected by an electromagnetic deflector 35-1. Then, it is directed onto a sample S along a trajectory indicated by 38-1 (for example, in a range of 4 to 15°) through an objective lens 36.

Secondary electrons emitted from the sample S by the irradiation of the primary electron beam pass through the objective lens 36-1, is limited to an appropriate resolution by an NA aperture 40-1, is converged by the tablet lens 42-1, and generates a magnified image at an object point 43-1 of an axial chromatic aberration correcting lens 44-1. This image forms images at a point 47-1 and a point 48-1 by the axial chromatic aberration correcting lens, and satisfies the Wien-condition of non-dispersion. The image at the point 48-1 is magnified by magnification lenses 49-1 and 50-1 at two stages, and a magnified image is focused on the detector D, thereby forming a two-dimensional image.

Tapered pipes 39-1 and 41-1 are disposed above and below the NA aperture 40-1 in order to shield a deflection magnetic field of the electromagnetic deflector 35-1 such that it does not leak to the trajectory of the second electron beam. Since the pipes are tapered such that the diameter is larger toward the lens and smaller toward the NA aperture, the two electrostatic lenses can be prevented from deteriorations in characteristics and the electrodes can be reduced in size.

Figure 6A:
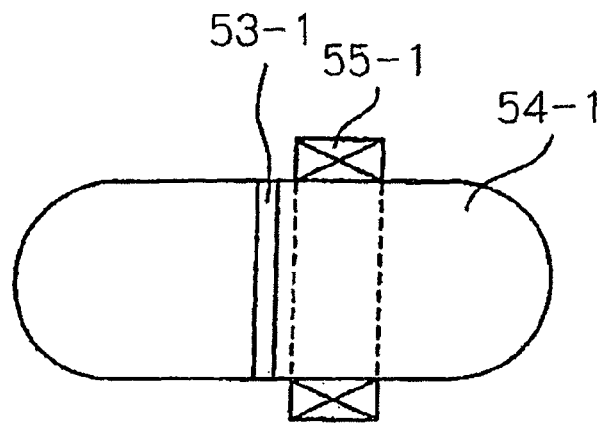
FIG. 6A is a diagram showing the configuration of an electromagnetic deflector provided in the electron beam apparatus shown in FIG. 6.

FIG. 6A is a diagram of the electromagnetic deflector 35-1 of the electron beam apparatus shown in FIG. 6, as viewed from the direction of an arrow b in FIG. 6. The electromagnetic deflector 35-1 comprises a permalloy core 54-1 which connects a magnetic gap 53-1, and the permalloy core is wound with an exciting coil 55-1.

The electromagnetic deflector 35-1 has the magnetic gap 53-1 of approximately 2 mm, the shape of which is perpendicular to the beam trajectory at a beam incident point and at a beam emanating point, as shown in FIG. 6. The electromagnetic deflector 35-1 has a shape of coupling the magnetic gap 53-1 with the permalloy core 54-1.

The permalloy core 54-1 which extends on the upper side of the sheet surface from the magnetic gap turns to the right in the figure, avoiding the optical axis, and extends to the back side of the sheet surface. Then, it turns to the left, and is connected to a gap which is positioned on the back side of the sheet surface.

Describing in a common manner to the fourth embodiment, the fifth embodiment is characterized in that the light path length of a beam which passes through the beam separator (i.e., electromagnetic deflector) 35-1 is short (zero in this example) on the secondary electron beam side which requires low aberration, and is long on the primary electron beam side which does not so much require low aberration.

Figure 7:
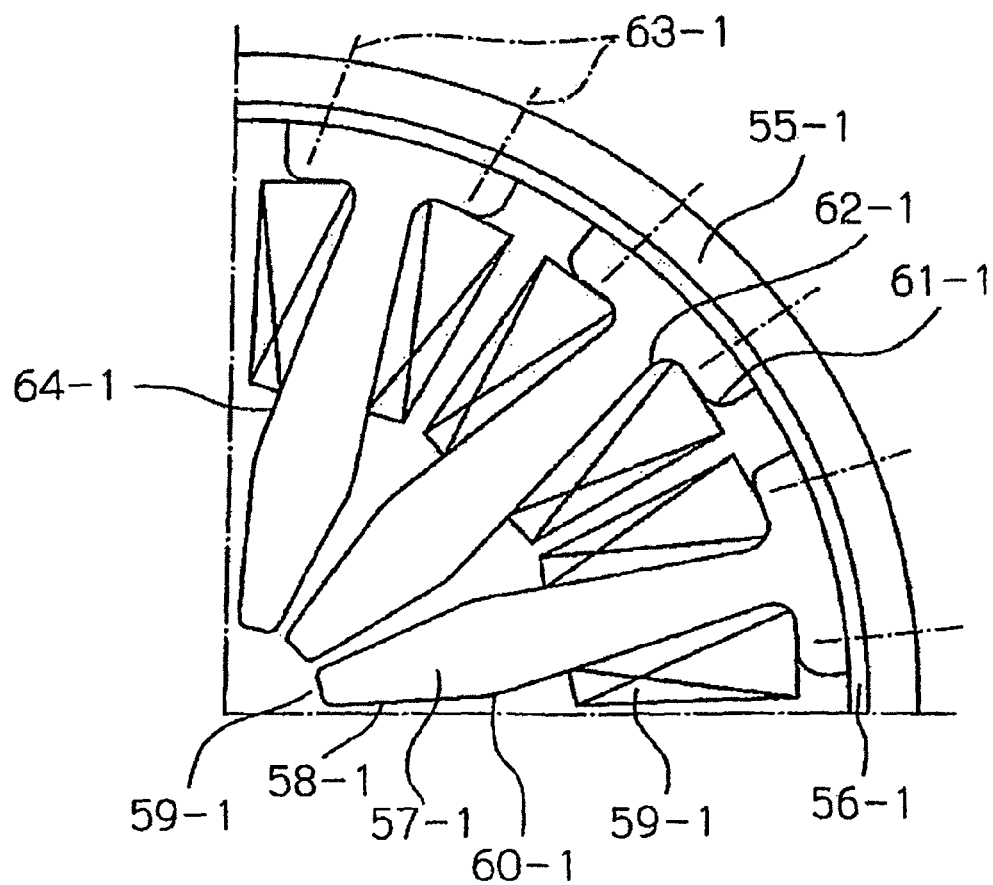
FIG. 7 is a cross-sectional view showing the configuration of an axial chromatic aberration correcting lens provided in the electron beam apparatuses shown in FIGS. 5 and 6.

FIG. 7 shows a cross-sectional view of the axial chromatic aberration correcting lens 5-1 in the fourth embodiment and the axial chromatic aberration correcting lens 44-1 (¼ cross-sectional view orthogonal to the optical axis) in the fifth embodiment shown in FIG. 6. The axial chromatic aberration correcting lens satisfies the non-dispersion condition by once forming an image at the center. In the axial chromatic aberration correcting lens, an electrode/magnetic pole (electromagnetic pole) 57-1 comprises a radial surface 58-1 near the optical axis, and a surface 64-1 around which an exciting coil 59-1 is wound. The surface 64-1 has a thickness which is smaller toward the outside, but the outermost end is thicker for screwing. All parts at which the respective surfaces cross or connect are curved surfaces so as not to form sharp edges. For example, the part of the electromagnetic pole 57-1 closest to the optical axis is set to approximately 0.5 R, a connection part of the surface 58-1 and the surface 64-1 to approximately 100 R, and left and right ends of the outermost end of the electromagnetic pole 57-1 are set to approximately 5 R.

Further, in the axial chromatic aberration correction lens, a metal cover is covered on the outside of each exciting coil 59-1 such that a covering insulator of the coil is not visible from the optical axis direction, and it is shielded by the metal covers such that even if the surface of a spacer 56-1 is charged, an electric field caused by the charge will not leak in the optical axis direction. The spacing between adjacent metal covers is set to a minimum width with which a discharge can be avoided. The electromagnetic pole 57-1 is screwed at two points in the circumferential direction to the core 55-1 at a position 63-1.

In the fourth and fifth embodiment according to the electron beam apparatuses of the present invention, as described above, the beam separator for separating the secondary electron beam from the primary electron beam can reduce aberration of the primary electro-optical system which occurs in the beam separator because the electron beam passing trajectory on the primary electro-optical system side is shorter than the secondary electron beam passing trajectory. Further, since the beam separator need not be placed at a position conjugate with the sample surface, the light path length can be largely reduced to thus reduce the space charge effect.

Also, in the fifth embodiment which has a projection electro-optical system, since the second electron beam does not pass through the beam separator, no aberration can occur in the beam separator.

Figure 8:
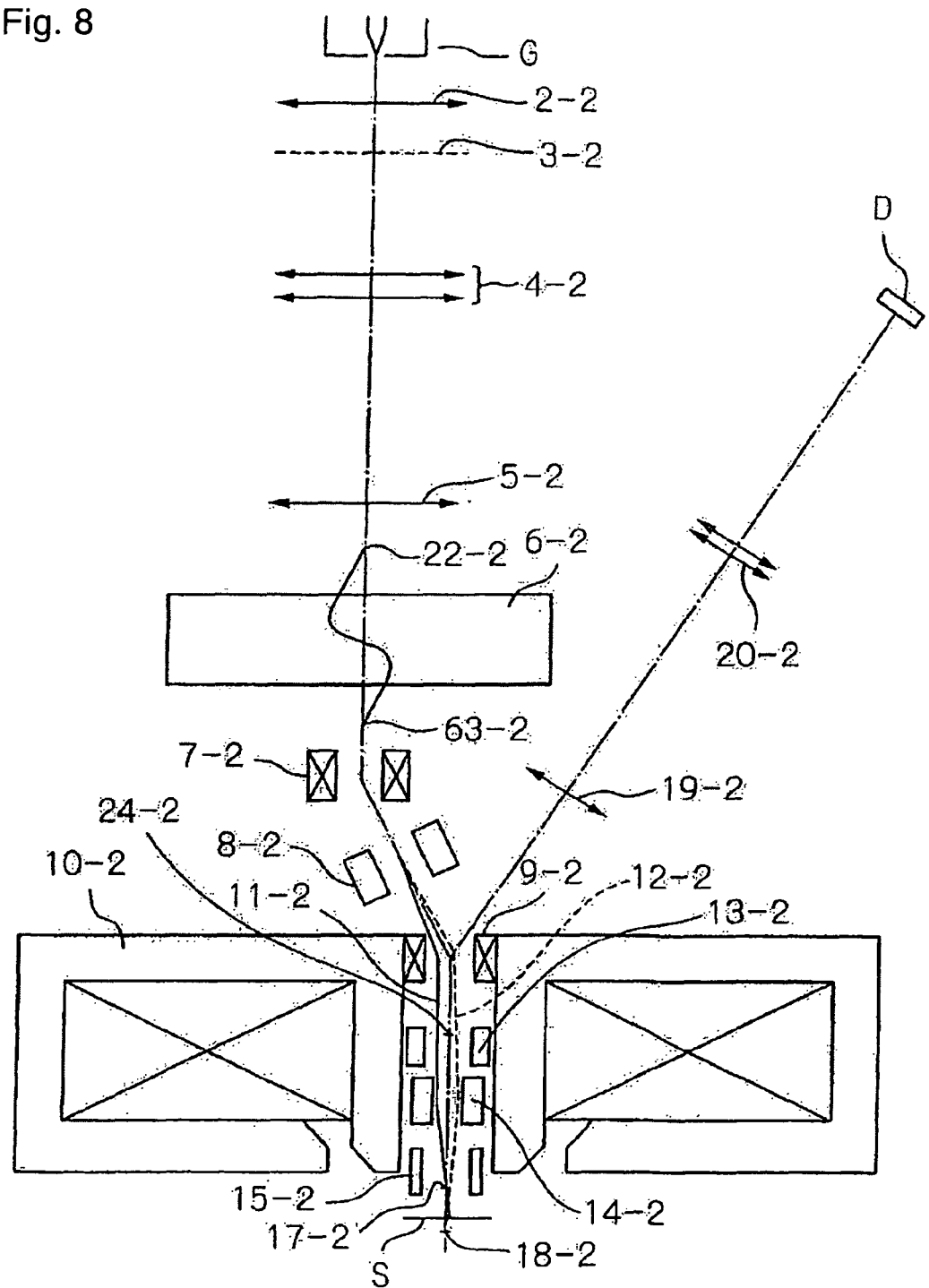
FIG. 8 is a diagram generally showing a sixth embodiment of an electron beam apparatus according to the present invention.

FIG. 8 is a schematic diagram showing a sixth embodiment of an electron beam apparatus according to the present invention. In this sixth embodiment, an electron beam emitted from an electron gun G is converged by a condenser lens 2-2, and is irradiated to a multi-aperture 3-2 at a uniform intensity. The beam which has transformed into a multi-beam through the multi-aperture 3-2 is reduced by a rotation adjusting lens 4-2 and a reduction lens 5-2 at two stages and creates a reduced image at a position 22-2. This position 22-2 is an object point of the an axial chromatic aberration correcting lens 6-2, and this lens forms an image having negative axial chromatic aberration at the same magnification at a position 23-2. This image is further reduced by an objective lens 10-2, and creates a reduced image on a sample S.

The axial chromatic aberration correcting lens 6-2 is a Wien-filter formed with 23 radially arranged electrodes/magnetic poles, and applies an electromagnetic field such that a beam emitted from the object point 22-2 once focuses at the center of the filter, and creates an image at the same magnification at the position 23-2. In this way, this Wien-filter focuses even beams of non-dispersion, i.e., different in energy at the position 23-2, i.e., the same XY position. This condition is called "non-dispersion Wien-condition" under which an electromagnetic field is applied such that an electric field is orthogonal to a magnetic field. Further, by applying a four-pole electric field and a four-pole magnetic field to 12 poles, a negative axial chromatic aberration coefficient can be generated. Specifically, a high-energy beam focuses at the position 23-2 on the electron gun G side of the position 23-2, while a low-energy beam focuses on the sample S side of the position 23-2. As an image at this position 23-2 is focused on the sample S through the objective lens 10-2, all energy electron beams focus at the same place because of positive axial chromatic aberration of the objective lens. Qualitatively, when the absolute value of the negative axial chromatic aberration coefficient created by the axial chromatic aberration correcting lens 6-2 is matched with the axial chromatic aberration coefficient at the object point of the objective lens 10-2, an image free from axial chromatic aberration can be generated on the sample surface S.

When axial chromatic aberration is present, even if the aperture angle limited to 20 mrad or less is increased to 30 mrad or more by correcting the axial chromatic aberration, a resolution of 25 nm or less can be achieved, and a resolution of 50 nm or less can be achieved even with an aperture angle of 60 mrad. Assuming an aperture angle of 60 mrad, a resulting beam current is nine times as large as that with an aperture angle of 20 mrad, thus enabling a high-speed evaluation.

In FIG. 8, the number 9-2 designates a beam separator which comprises an electromagnetic deflector, and deflection chromatic aberration is corrected by an electromagnetic deflector 7-2. The primary electron beam scans on the surface of the sample S by electrostatic deflectors 8-2, 13-2. For performing a pattern evaluation, and for measuring a Z-position (position in the Z-direction, i.e., position in the axial direction) while changing the focus condition as later described, a position 24-2 spaced by 38.7 mm from the sample surface is defined as a deflection center. This is a value which is found by a simulation so as to minimize the sum of comma aberration and deflection chromatic aberration. Also, as will be later described, for capturing a signal waveform to measure a Z-position, the primary beam is forced to trace a trajectory of 11-2 or 12-2, and the deflection center is placed at 17-2 or 18-2. These positions are positions close to the sample S.

An axially symmetric lens 15-2 is applied with a high positive voltage which does not cause a discharge to reduce spherical aberration. 14-2 designates a cylindrical electrode for dynamic focusing which is capable of adjusting a focus position in a range of approximately +50 μm with a voltage of about 100 V.

In this regard, when the focal distance of a lens is to be changed at high speeds, an electromagnetic lens is often provided with a dynamic focus coil to vary its coil current. If the focal distance can be changed by a required value with a change in voltage of approximately 100 V, dynamic focusing can be performed at higher speeds. In this embodiment, the focus is adjusted by the axially symmetric electrode 14-2 disposed at a place at which the magnetic field of the objective lens is not zero. Specifically, as a positive voltage is applied to this axially symmetric electrode 14-2, beam energy passing through the electrode is slightly increased, and the focal distance can be slightly increased. Conversely, as a negative voltage is applied, a convergence force is slightly increased, and the focal distance can be reduced.

Secondary electrons separated by the beam separator 9-2 are adjusted in scaling factor by magnification lenses 19-2, 20-2, and are detected by a detector (multi-detector) D. Here, a rotary lens is used for the lens 20-2, and the direction of a two-dimensional image is matched with a detector arranging direction by this lens.

Figure 9A:
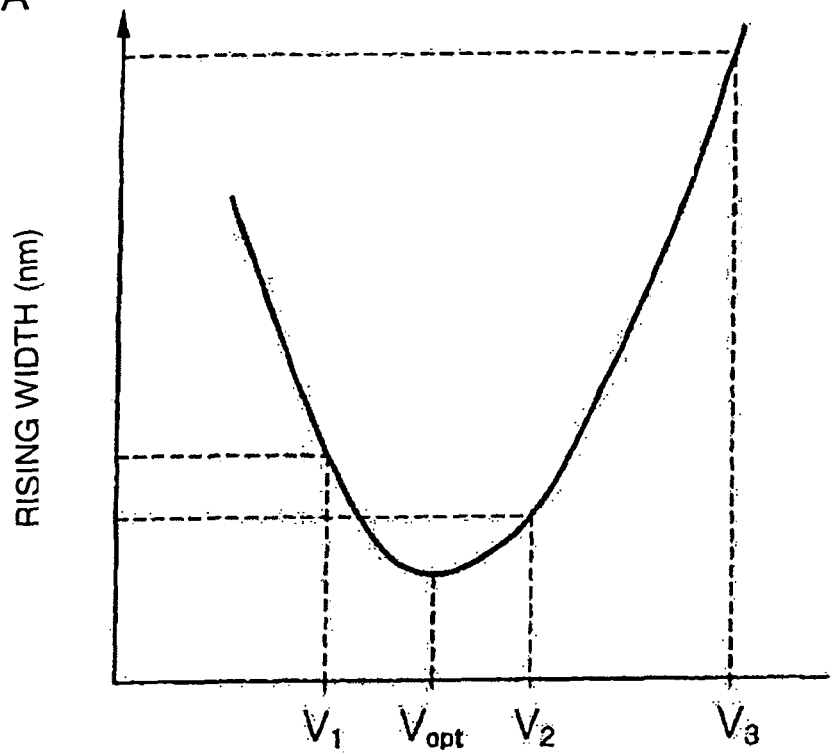
FIG. 9A is an explanatory diagram for finding an optimal focusing condition in the electron beam apparatus according to the present invention.
Figure 9B:
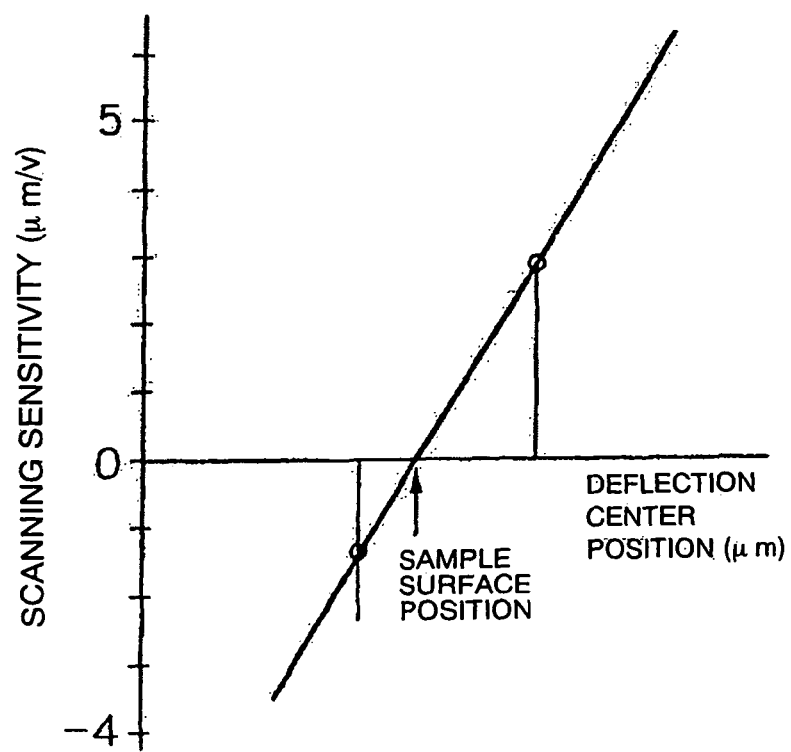
FIG. 9B is an explanatory diagram for finding an optimal focusing condition in the electron beam apparatus according to the present invention.
Figure 10:
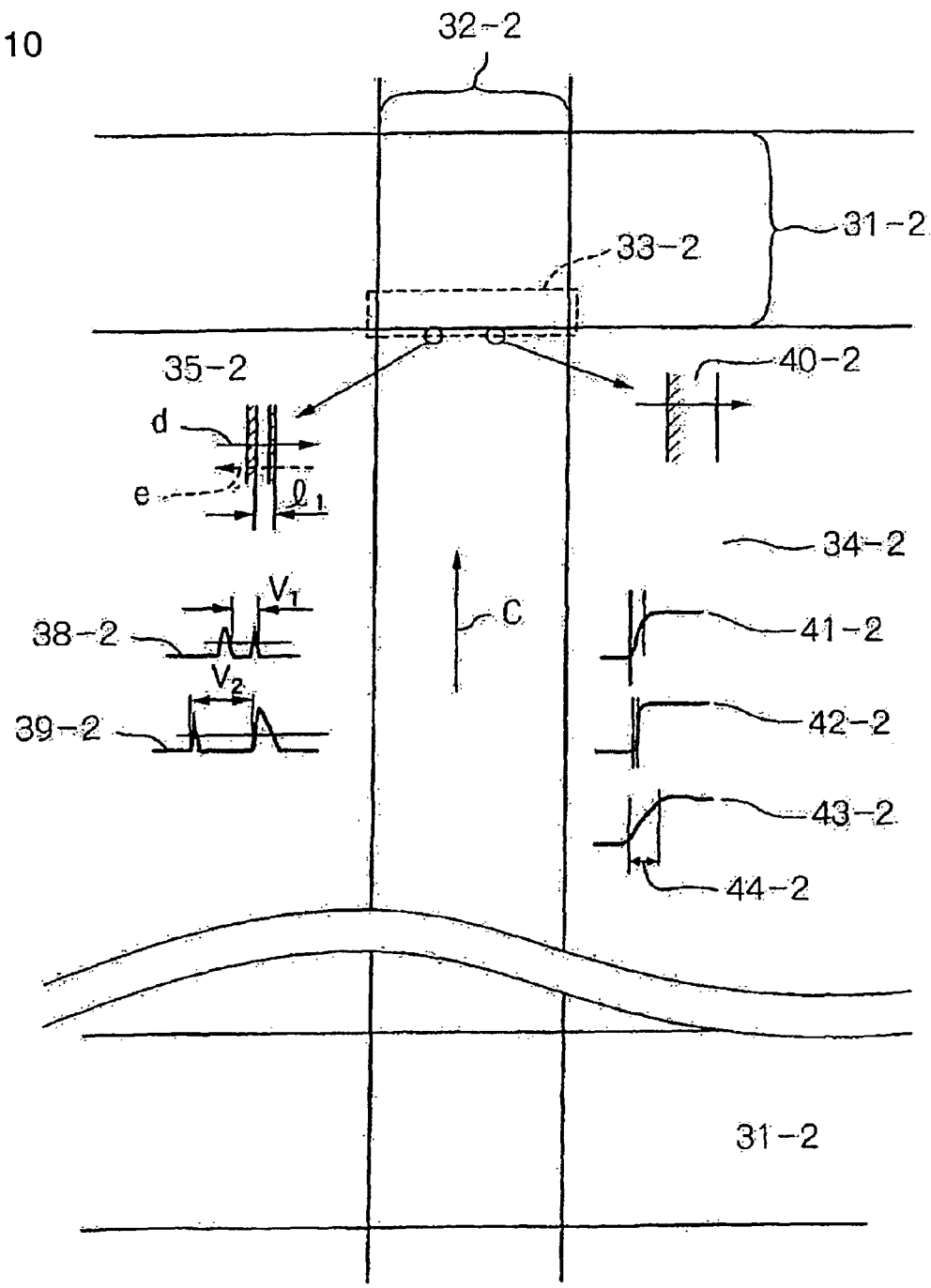
FIG. 10 is an explanatory diagram of a pattern evaluation method executed in the electron beam apparatus according to the present invention.

With reference to FIGS. 9A, 9B and 10, a description will be made on a method of measuring a Z-position on a sample surface during a pattern evaluation using the electron beam apparatus according to the present invention. It should be understood that while the following description is made in connection with the six embodiment shown in FIG. 8, a Z-position can be measured in a similar manner in the electron beam apparatuses of the other embodiments. In FIG. 10, 31-2 designates a dicing line, 32-2 one stripe, and 33-2 a visual field of the electro-optical system which has, for example, a size of 200 μm×50 μm. 34-2 designates a pattern area of a die. A sample S continuously moves in the Y-direction indicated by an arrow c. As the visual field 33-2 enters the pattern area 34-2, the beam is moved to a place where an X-direction or a Y-direction pattern, which differs in two widths, exists, as indicated by 35-2, and there, the beam is scanned in a rectangular direction of the pattern by the deflectors 8-2, 13-2. As a result, when the deflection center is positioned above the surface of the sample S as indicated by 17-2 (FIG. 8), a beam running direction is a direction indicated by a solid-line arrow d, and as indicated by 38-2, a secondary electron signal corresponding to a wider pattern is first generated, followed by the generation of a secondary electron signal corresponding to a narrower pattern. In this event, when the deflection center is moved below the surface of the sample S, as indicated by 18-2 (FIG. 8), and the same scanning signal is applied, the beam running direction is a direction indicated by a dotted-line arrow e, a secondary electron signal corresponding to the narrow pattern is first generated, followed by the generation of a signal corresponding to the wider pattern, thus resulting in a signal waveform indicated by 39-2.

A line interval 11 divided by a voltage pulse interval $V_1$ or $V_2$ of the signal waveform, i.e., a scanning sensitivity (μm/V) rides on a straight line, as shown in FIG. 9B, when it is plotted on the vertical axis. In this regard, when a sample is scanned by the deflectors 8-2, 13-2 at two stages, the scan is performed with the deflection center being fixed by changing a voltage applied to the upper deflector 8-2 and a voltage applied to the lower deflector 13-2 while the voltage ratio is fixed. When the deflection center must be changed, this voltage ratio is changed, in which case, one voltage is fixed, while the other voltage alone is changed to change the voltage ratio. When the scanning sensitivity is defined, the canning sensitivity can be defined in common even if the deflection center is changed when it is defined with the fixed voltage. Specifically, the scanning sensitivity is higher as the deflection center is placed far from the sample, while the scanning sensitivity presents a negative value when the deflection center is placed below the sample. The voltage V of the scanning sensitivity (μm/V) shown in FIG. 9B is a voltage applied to a deflector, which is not changed when the deflection center is changed.

Since the scanning sensitivity is represented by a straight line, arbitrary two points may be assigned as deflection positions. A Z-position is a point at which this straight line crosses the scanning sensitivity 0. The relationship between the Z-position and an exciting voltage for the objective lens 10-2 has been previously measured and listed, so that the exciting voltage for the objective lens can be converted from the value of the Z-position.

In the foregoing method of measuring a pattern interval, two narrow patters are required. When no such patterns are available, a measurement may be made at a rising of the signal waveform of a pattern edge. In this event, a focusing condition may be found by changing a lens condition, i.e., an objective lens condition, as described below.

When the signal waveform is acquired while changing the focusing condition three times, and when a pattern edge indicated by 40-2 in FIG. 10 is scanned by a beam in a direction perpendicular to the edge, waveforms indicated by 41-2, 42-2, 43-2 in FIG. 10 are resulted. When the horizontal axis represents a voltage applied to the axially symmetric electrode 13-2 to which the focusing condition is applied, and the vertical axis represents a rising width 44-2 of a signal, a curve is plotted as shown in FIG. 9A. When this curve is approximated by a second-order curve, an optimal voltage value $V_{opt}$ is derived for an objective lens which presents the narrowest signal rising edge. The voltage $V_{opt}$ corresponds to the Z-position.

Accordingly, the voltage value for the objective lens 10-2 is set to $V_{opt}$, and an evaluation may be made with the condition of this objective lens until the next measurement. In other words, patterns can be evaluated with minimum blurring.

Next, a description will be made on whether the Z-position is measured at intervals of how many millimeters, and whether or not the focus must be finely adjusted when a sample is evaluated while a stage is continuously moved. In this event, the focus depth must be first estimated. As described in connection with FIG. 8, when axial chromatic aberration is corrected, an aperture angle of 30 mrad or more can be utilized. In this event, the focus depth is calculated as $30 \text{ nm}/30\times10^{-3}=1$ μm assuming that blurring of 30 nm is allowed. The Z-position on a sample carrier or a substrate fluctuate mainly due to fluctuations in variations in thickness of the sample S, and Z vibrations of the stage. From an estimated value of these Z-position fluctuations, a period at which the focusing condition is measured or the number of times of measurements is found as shown below.

Since the fluctuations in variations in thickness of the sample S have a long period, a Z-position measuring period is determined by Z vibrations of the stage. The stage is moved at a speed at which patterns are evaluated, an acceleration pickup is having a sensitivity in the Z-direction is attached to the stage, and the signal waveform is measured in an amplitude mode. A running distance of the stage required to change the amplitude waveform by 1 μm is found, the Z-position is measured at intervals shorter than the running distance, and focusing may be performed. When the stage is a contact support system, such as a roller bearing or the like, measurements may be made at intervals of approximately 1 mm.

Alternatively, when the stage is a non-contact support system, such as an air bearing or the like, upward/downward movements are 1 μm or less even if the stage runs by 100 mm or more, and the sample varies more in thickness, so that in this event, a measurement may be made on a die-by-die basis.

Next, a description will be made on a method of determining a stage speed when an image of a sample is taken using an electron beam apparatus of the present invention. In this event, the conditions are as follows:

Number of Beams: 16
Scan Pixel Frequency of Each Beam: 50 MHz/pix
Scan Settling Time: 10 μs
Stripe: 200 μm
Pixel Dimensions: 50 nm square
Z-Position Measurement Period: 1 mm interval A time such as a focusing condition measurement or the like is longer in a method of changing the lens condition three times without changing the deflection center than in the method of changing the deflection center, the time is estimated under this condition. The lens voltage settlement is a total of 5 ms which consist of a total of four times for three conditions and Vopt, assuming that it takes 1 ms to change a voltage applied to the electrode 14-2 for dynamic focus by approximately 100 V, and 1 ms for a signal capture and the like.

A time required to move a distance stage of 1 mm to evaluate a pattern is:

$$[(1 \text{ mm} \times 200 \text{ μm})/(16 \times 50 \times 10^{-9} \times 50 \times 10^{-9})] \times$$
$$20 \times 10^{-9} \text{ s} + [10 \text{ μm} \times 100]/(50 \times 10^{-9} \text{ m})] \times$$
$$20 \times 10^{-9} \text{ s} + [1 \text{ mm}/(16 \times 50 \times 10^{-9})] \times 10 \text{ μs} + 5 \text{ ms} =$$
$$0.1 \text{ s} + 0.004 \text{ s} + 0.0125 \text{ s} + 0.005 \text{ s}$$

Here, the first term is a pixel scanning time (time for which 16 beams scan an area of 1 mm×200 μm), the second term is a signal waveform capturing time (for example, a time taken to capture the values of the voltages V1 and V2 in the embodiment of FIG. 9A), the third term is a scan settling time (product of the number of times 16 beams turn back for scanning an area of 1 mm×200 μm and a time required for the fold-back), and the fourth term is a focus calculating time.

Thus, the stage moving speed can be calculated by:

$$1 \text{ mm}/(0.1 + 0.004 + 0.0125 + 0.005)\text{sec} = 8.51 \text{ mm/sec}$$

The distance by which the stage moves for a scanning time for Z-position measurement and a Z-position calculating time 0.005 seconds is:

$$8.51 \text{ mm/s} \times 0.005 \text{ s} = 42.5 \text{ μm}$$

Therefore, when the beams are moved in the Y-direction (stage moving direction) by 42.5 μm before the measurement of the Z-position, and Z-position is measured there, 0.005 seconds is taken to complete the Z-position measurement. Then, in the meantime, the stage has advanced by 42.5 μm, a pattern evaluation can be immediately initiated.

Accordingly, the visual field of 42.5 μm or more is required in the Y-direction. This value indicates that approximately one quarter of the stripe width 200 μm is required for the visual field. (As shown in the aforementioned conditions, the stage speed is a function of the stripe width.) In this way, before the Z-position is measured, the beam is moved in a direction in which a sample carrier is moved by one quarter of the stripe width or more, and then the Z-position may be measured.

In doing so, a pattern under evaluation reaches the center of the visual field in the Y-direction when the Z-position measurement is completed, so that the evaluation can be made about the center of the visual field in the Y-direction. In this regard, while the stage speed is found when the focusing condition measurement interval is 1 mm in the foregoing example, the stage speed of a general stage may be found from a pixel scanning time for the focusing condition measurement interval, a signal wave form capturing time, a scan settling time, and a focus calculating time.

In a prior art, a highly accurate stage is employed, and a Z-map of a sample surface corresponding to variations in thickness of a wafer is created to perform dynamic focusing. Such a method has problems of a lower throughput due to a time required to fabricate the Z-map, and an excessively expensive stage which requires a high accuracy for duplicating the Z-position. In the present invention, as described above, since the fabrication of the Z-map is eliminated by performing the focusing immediately before a pattern is evaluated, a high throughput is accomplished, and an expensive stage is not required. Also, even using an electro-optical system which corrects axial chromatic aberration to use a large aperture angle, a sample can be evaluated with high accuracy by reducing defocusing.

When the electron beam apparatus according to each embodiment of the present invention described above is used in a semiconductor wafer inspection process, even a semiconductor device having miniature patterns can be accurately inspected for defects without faulty two-dimensional electron images, the yield rate of products can be increased, and defective products can be prevented from shipment.

In addition, the pattern evaluation of the present invention can be widely applied to sample pattern evaluations such as defect inspections for samples such as a photo-mask, a reticle, a wafer and the like, a line width measurement, an alignment accuracy, a potential contrast measurement and the like.

While the preferred embodiments of the present invention have been described above, it should be apparent to those skilled in the art that the present invention is not limited to the configurations of these embodiments, but a variety of alterations and modifications can be made to the invention.

The invention claimed is:

1. An electron beam apparatus comprising:
   an electron gun for emitting a primary electron beam;
   an electromagnetic deflector for deflecting the primary electron beam;
   a beam separator for separating the primary beam and secondary electrons emitted from a sample when the sample is irradiated with the primary electron beam; and
   a detector for detecting a secondary electron beam,
   wherein the beam separator is configured such that a distance by which the secondary electron beam runs through the beam separator is three times longer than a distance by which the primary electron beam runs through the beam separator.

2. An electron beam apparatus according to claim 1, wherein the electromagnetic deflector is configured such that the primary electron beam is deflected in a direction opposite to a deflection direction in which the beam separator deflects the primary electron beam, and deflection chromatic aberration occurring in the primary electron beam due to the deflection of the electromagnetic deflector is equal to the absolute value of deflection chromatic aberration occurring in the primary electron beam due to the deflection of the beam separator.

3. An electron beam apparatus according to claim 1, wherein the beam separator comprises ferromagnetic material bodies and exciting coils wound around the ferromagnetic material bodies, respectively, and each of the bodies has two magnetic pole surfaces which are magnetically connected to the magnetic surfaces of another body.

4. An electron beam apparatus according to claim 1, wherein the beam separator is adapted to deflect the primary electron beam by a first angle to direct the primary electron beam onto the sample at a second angle which is inclined from a normal of the sample surface, and deflect the second electrons by a third angle which is equal to zero, by rendering a length of an optical path in the beam separator through which the secondary electrons passes, substantially zero.

* * * * *